US011817410B2

(12) United States Patent
Chiou et al.

(10) Patent No.: US 11,817,410 B2
(45) Date of Patent: Nov. 14, 2023

(54) INTEGRATED CIRCUIT PACKAGE AND METHOD

(71) Applicant: Taiwan Semiconductor Manufacturing Co., Ltd., Hsinchu (TW)

(72) Inventors: Wen-Chih Chiou, Zhunan Township (TW); Chen-Hua Yu, Hsinchu (TW); Shih Ting Lin, Taipei (TW); Szu-Wei Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/876,159

(22) Filed: Jul. 28, 2022

(65) Prior Publication Data

US 2022/0375890 A1 Nov. 24, 2022

Related U.S. Application Data

(63) Continuation of application No. 17/139,192, filed on Dec. 31, 2020, now Pat. No. 11,469,197.

(Continued)

(51) Int. Cl.
*H01L 21/56* (2006.01)
*H01L 23/31* (2006.01)
(Continued)

(52) U.S. Cl.
CPC ............ *H01L 24/08* (2013.01); *H01L 21/486* (2013.01); *H01L 21/565* (2013.01);
(Continued)

(58) Field of Classification Search
CPC ....... H01L 24/08; H01L 24/80; H01L 21/486; H01L 21/565; H01L 23/295;
(Continued)

(56) References Cited

U.S. PATENT DOCUMENTS 8,993,380 B2 3/2015 Hou et al.
9,281,254 B2 3/2016 Yu et al.
(Continued)

FOREIGN PATENT DOCUMENTS

JP 2017167058 A 9/2017
KR 20160006094 A 1/2016
KR 20180114491 A 10/2018

*Primary Examiner* — Thanh Y. Tran
(74) *Attorney, Agent, or Firm* — Slater Matsil, LLP

(57) ABSTRACT

In an embodiment, a device includes: an interposer; a first integrated circuit device bonded to the interposer with dielectric-to-dielectric bonds and with metal-to-metal bonds; a second integrated circuit device bonded to the interposer with dielectric-to-dielectric bonds and with metal-to-metal bonds; a buffer layer around the first integrated circuit device and the second integrated circuit device, the buffer layer including a stress reduction material having a first Young's modulus; and an encapsulant around the buffer layer, the first integrated circuit device, and the second integrated circuit device, the encapsulant including a molding material having a second Young's modulus, the first Young's modulus less than the second Young's modulus.

20 Claims, 20 Drawing Sheets

Related U.S. Application Data

(60) Provisional application No. 63/070,468, filed on Aug. 26, 2020.

(51) Int. Cl.

| | |
|---|---|
| ***H01L 25/065*** | (2023.01) |
| ***H01L 23/00*** | (2006.01) |
| ***H01L 23/29*** | (2006.01) |
| ***H01L 23/498*** | (2006.01) |
| ***H01L 25/00*** | (2006.01) |
| ***H01L 21/48*** | (2006.01) |

(52) U.S. Cl.
CPC ........ *H01L 23/295* (2013.01); *H01L 23/3128* (2013.01); *H01L 23/3135* (2013.01); *H01L 23/49827* (2013.01); *H01L 23/562* (2013.01); *H01L 24/80* (2013.01); *H01L 25/0655* (2013.01); *H01L 25/50* (2013.01); *H01L 2224/08225* (2013.01); *H01L 2224/80895* (2013.01); *H01L 2224/80896* (2013.01); *H01L 2924/35121* (2013.01)

(58) Field of Classification Search
CPC ............. H01L 23/3128; H01L 23/3135; H01L 23/49827; H01L 23/562; H01L 25/50; H01L 25/0655; H01L 2224/80896; H01L 2224/08225
See application file for complete search history.

(56) References Cited

U.S. PATENT DOCUMENTS

| | | | | |
|---|---|---|---|---|
| 9,299,649 | B2 | 3/2016 | Chiu et al. | |
| 9,372,206 | B2 | 6/2016 | Wu et al. | |
| 9,425,126 | B2 | 8/2016 | Kuo et al. | |
| 9,443,783 | B2 | 9/2016 | Lin et al. | |
| 9,461,018 | B1 | 10/2016 | Tsai et al. | |
| 9,496,189 | B2 | 11/2016 | Yu et al. | |
| 9,666,502 | B2 | 5/2017 | Chen et al. | |
| 9,735,131 | B2 | 8/2017 | Su et al. | |
| 9,847,317 | B2 | 12/2017 | Yu et al. | |
| 2018/0138101 | A1* | 5/2018 | Yu | H01L 23/481 |
| 2018/0294212 | A1 | 10/2018 | Chen et al. | |
| 2019/0103353 | A1* | 4/2019 | Liu | H01L 25/0655 |
| 2019/0164860 | A1* | 5/2019 | Lin | H01L 23/49816 |
| 2021/0098421 | A1* | 4/2021 | Wu | H01L 24/16 |
| 2021/0125885 | A1 | 4/2021 | Chen et al. | |

* cited by examiner

INTEGRATED CIRCUIT PACKAGE AND METHOD

PRIORITY CLAIM AND CROSS-REFERENCE

This application is a continuation of U.S. patent application Ser. No. 17/139,192 filed on Dec. 31, 2020, entitled "Integrated Circuit Package and Method," which claims the benefits of U.S. Provisional Application No. 63/070,468, filed on Aug. 26, 2020, which applications are hereby incorporated herein by reference in their entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
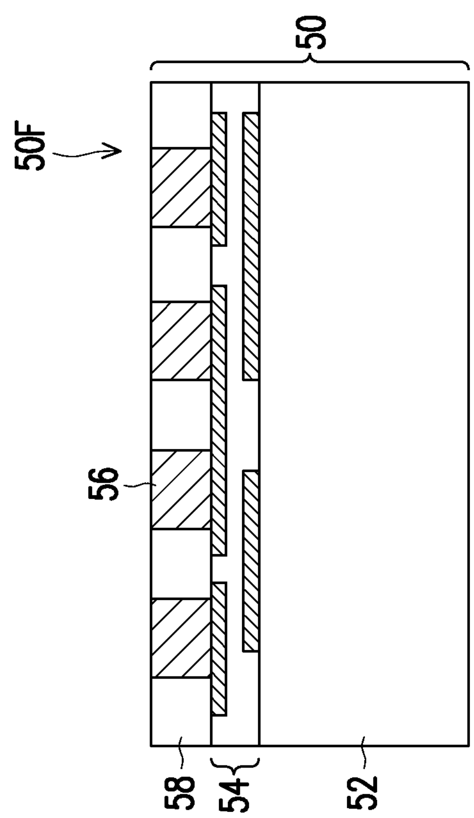
FIG. 1 is a cross-sectional view of an integrated circuit device.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages are formed by directly bonding integrated circuit devices to a wafer that contains another device, such as an interposer. Stress buffer layers are formed around the integrated circuit devices before the integrated circuit devices are encapsulated. The stress buffer layers are formed of a material that helps protect the integrated circuit devices during expansion of the encapsulant at high temperatures. The yield and reliability of the integrated circuit packages may thus be improved.

FIG. 1 is a cross-sectional view of an integrated circuit device 50. Multiple integrated circuit devices 50 will be packaged in subsequent processing to form integrated circuit packages. Each integrated circuit device 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit device 50 may be formed in a wafer, which may include different device regions that are singulated in subsequent steps to form a plurality of integrated circuit devices 50. The integrated circuit device 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect the devices of the semiconductor substrate 52. The metallization patterns may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit device 50. The die connectors 56 may be conductive pillars, pads, or the like, to which external connections are made. The die connectors 56 are in and/or on the interconnect structure 54. For example, the die connectors 56 may be part of an upper metallization pattern of the interconnect structure 54. The die connectors 56 can be formed of a metal, such as copper, aluminum, or the like, and can be formed by, for example, plating, or the like.

Optionally, solder regions (e.g., solder balls or solder bumps) may be disposed on the die connectors 56 during formation of the integrated circuit device 50. The solder balls may be used to perform chip probe (CP) testing on the integrated circuit device 50. CP testing may be performed on the integrated circuit device 50 to ascertain whether the integrated circuit device 50 is a known good die (KGD). Thus, only integrated circuit devices 50, which are KGDs, undergo subsequent processing and are packaged, and devices which fail the CP testing are not packaged. After testing, the solder regions may be removed in subsequent processing steps.

A dielectric layer 58 is at the front side 50F of the integrated circuit device 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit device 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After planarization, top surfaces of the die connectors 56 and the dielectric layer 58 are coplanar (within process variations) and are exposed at the front side 50F of the integrated circuit device 50. As will be described in greater detail below, the planarized front side 50F of the integrated circuit device 50 will be bonded to another device, such as an interposer.

In some embodiments, the integrated circuit device 50 is a stacked device that includes multiple semiconductor substrates 52. For example, the integrated circuit device 50 may be a memory device that includes multiple memory dies such as a hybrid memory cube (HMC) device, a high bandwidth memory (HBM) device, or the like. In such embodiments, the integrated circuit device 50 includes multiple semiconductor substrates 52 interconnected by through-substrate vias or through-silicon vias (TSVs). Each of the semiconductor substrates 52 may (or may not) have a separate interconnect structure 54.

Figure 7:
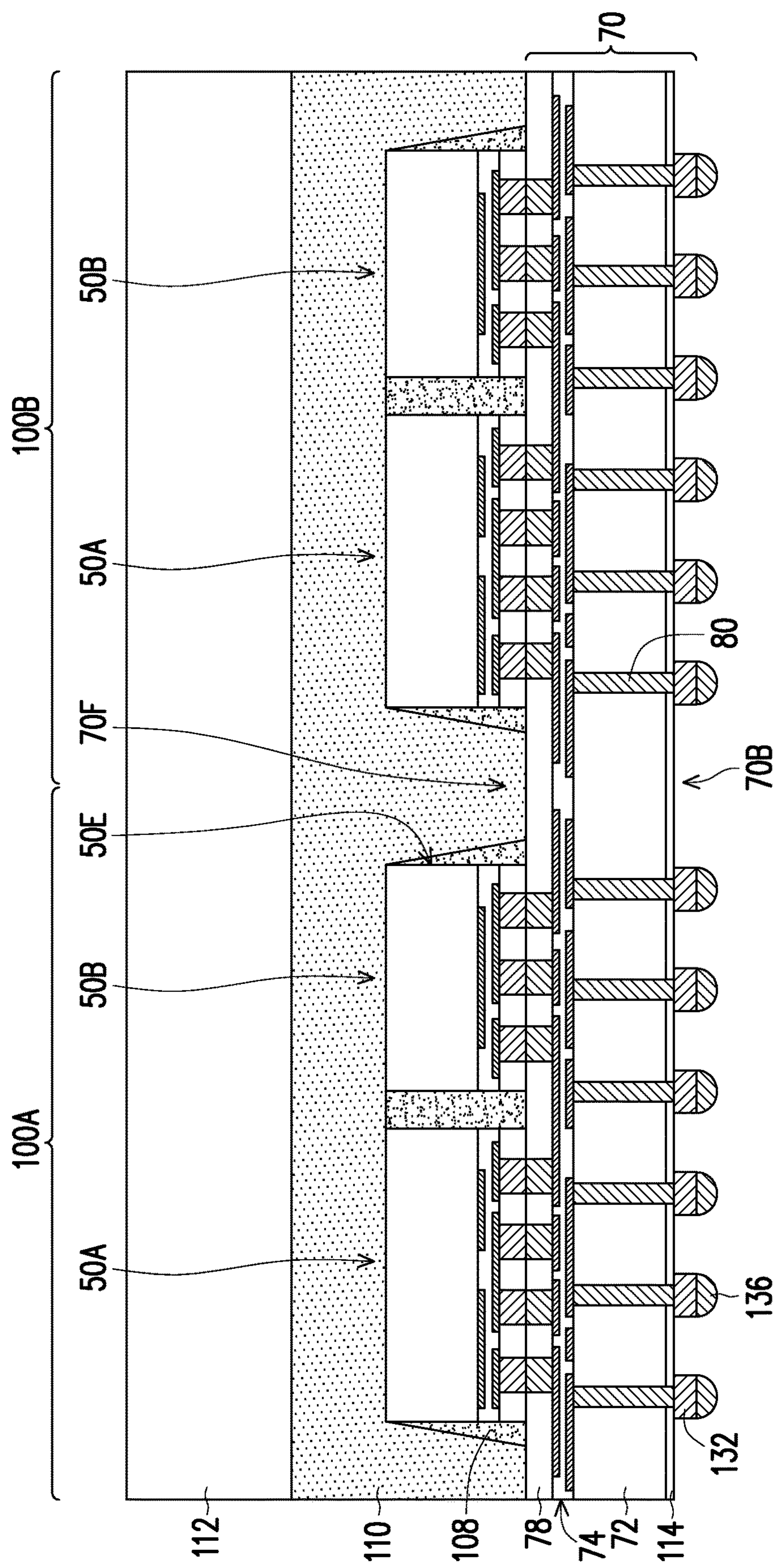
Figure 8:
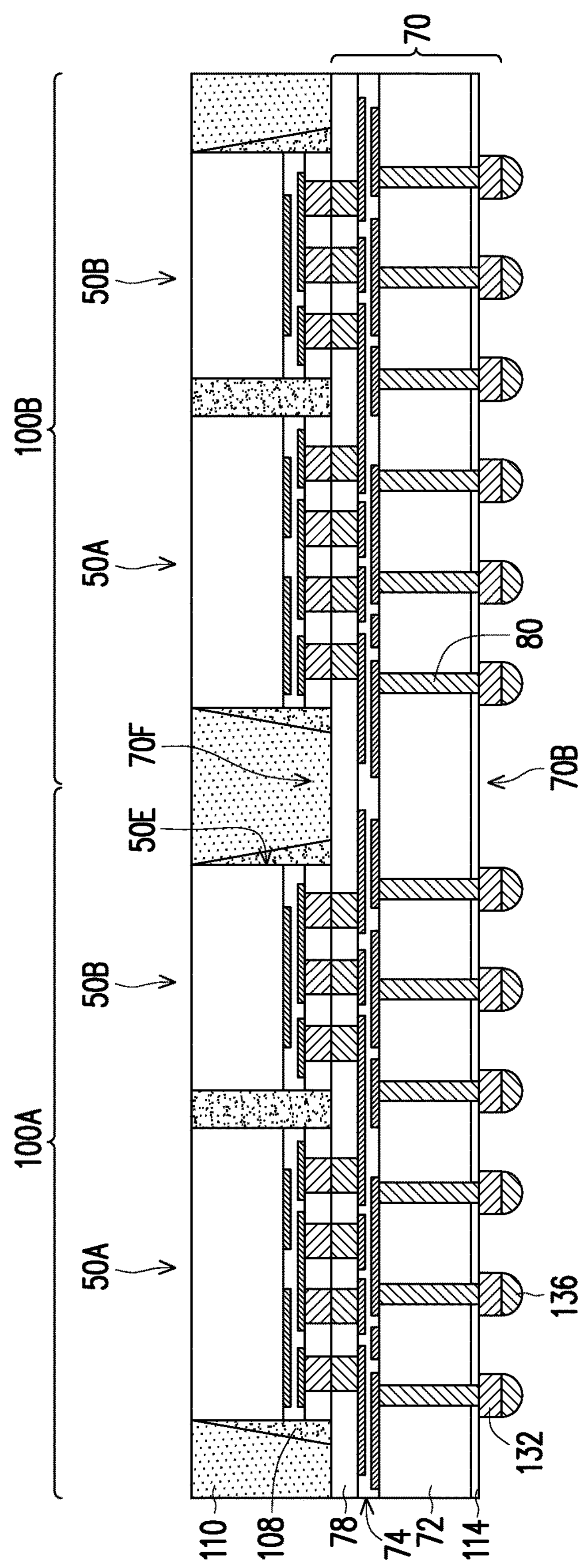
Figure 9:
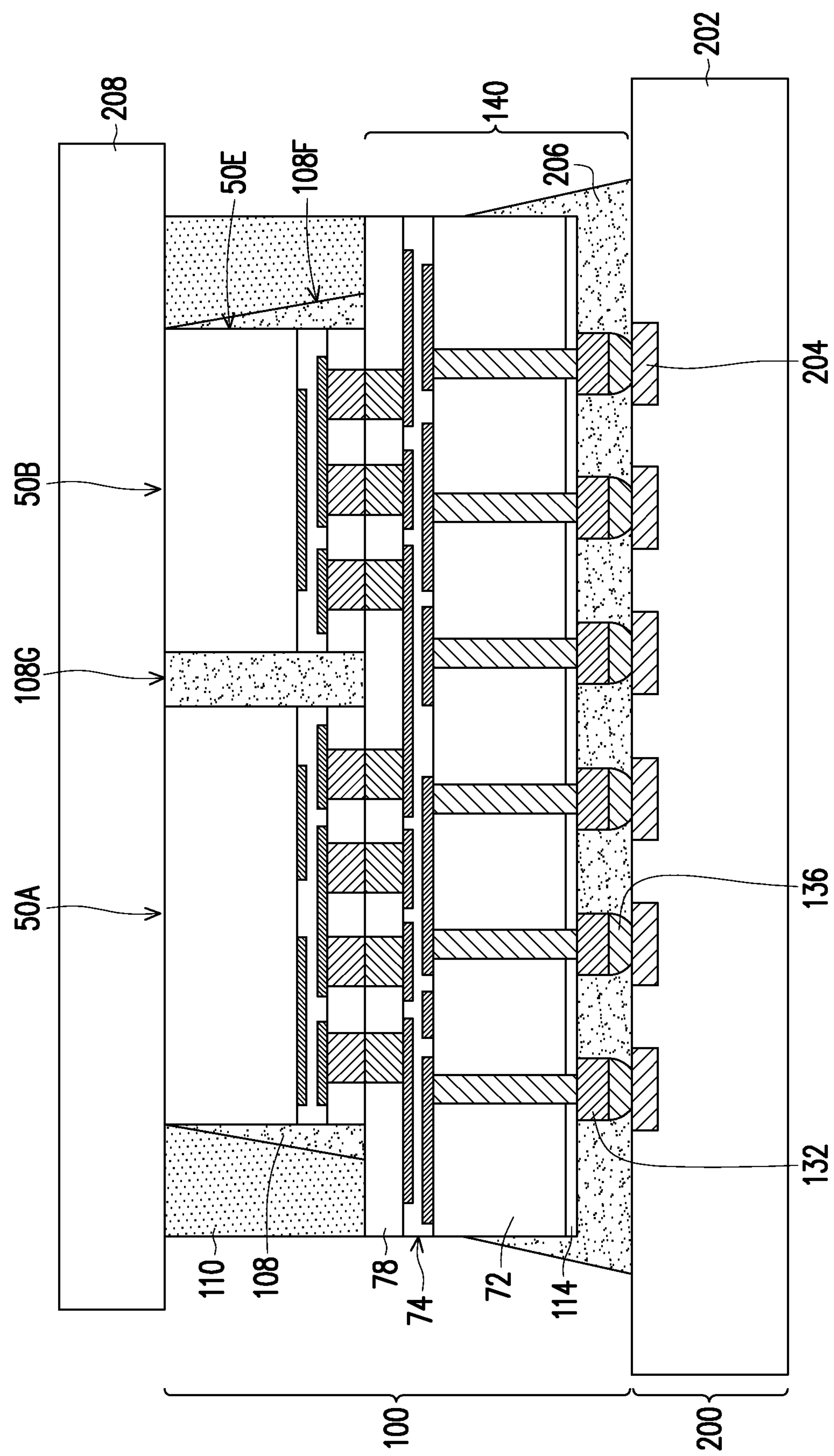

FIGS. 2 through 9 are cross-sectional views of intermediate steps during a process for forming integrated circuit packages, in accordance with some embodiments. In FIGS. 2 through 8, integrated circuit packages 100 are formed by bonding integrated circuit devices 50 to a wafer 70. In an embodiment, the integrated circuit packages 100 are chip-on-wafer (CoW) packages, although it should be appreciated that embodiments may be applied to other three-dimensional integrated circuit (3DIC) packages. The wafer 70 has package regions 100A, 100B, which each include devices formed therein, such as interposers. In FIG. 9, the package regions 100A, 100B are singulated to form integrated circuit packages 100 that each include a singulated portion of the wafer 70 (e.g., an interposer 140, see FIG. 9) and the integrated circuit devices 50 that are bonded to the singulated portion of the wafer 70. The integrated circuit packages 100 are then mounted to a package substrate 200. In an embodiment, the resulting device is a chip-on-wafer-on-substrate (CoWoS) package, although it should be appreciated that embodiments may be applied to other 3DIC packages.

Figure 2:
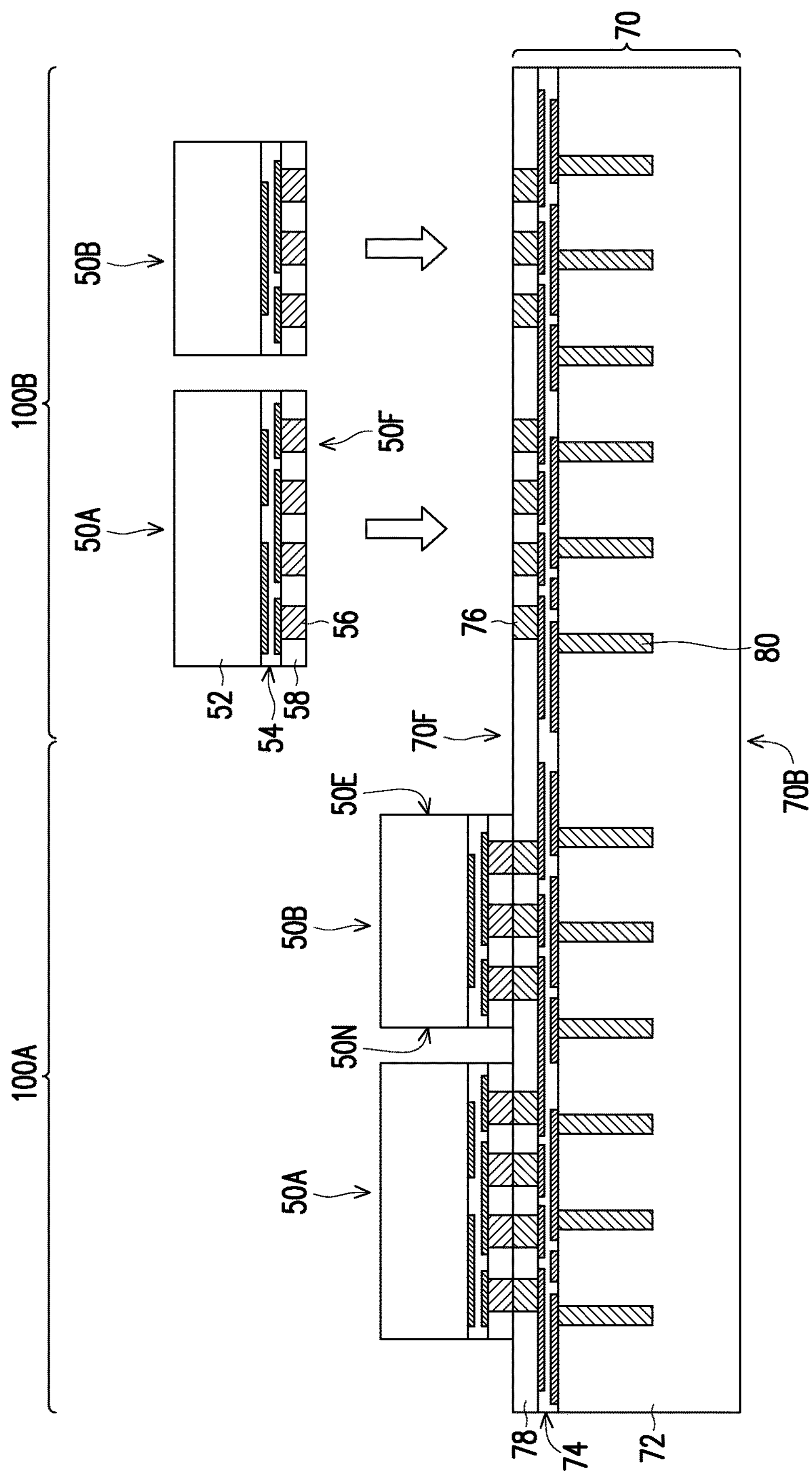
FIGS. 2 through 9 are cross-sectional views of intermediate steps during a process for forming integrated circuit packages, in accordance with some embodiments.

In FIG. 2, a wafer 70 is obtained. The wafer 70 comprises devices in the package regions 100A, 100B, which will be singulated in subsequent processing to be included in the integrated circuit packages 100. The devices formed in the wafer 70 may be interposers, integrated circuits dies, or the like. The wafer 70 includes a substrate 72, an interconnect structure 74, die connectors 76, a dielectric layer 78, and conductive vias 80.

The substrate 72 may be a bulk semiconductor substrate, a semiconductor-on-insulator (SOI) substrate, a multi-layered semiconductor substrate, or the like. The substrate 72 may include a semiconductor material, such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 72 may be doped or undoped. In embodiments where interposers are formed in the wafer 70, the substrate 72 generally does not include active devices therein, although the interposers may include passive devices formed in and/or on a front surface (e.g., the surface facing upward) of the substrate 72. In embodiments where integrated circuits devices are formed in the wafer 70, active devices such as transistors, capacitors, resistors, diodes, and the like, may be formed in and/or on the front surface of the substrate 72.

The interconnect structure 74 is over the front surface of the substrate 72, and is used to electrically connect the devices (if any) of the substrate 72. The interconnect structure 74 may include one or more dielectric layer(s) and respective metallization pattern(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization patterns may include conductive vias and/or conductive lines to interconnect any devices together and/or to an external device. The metallization patterns may be formed of a conductive material, such as a metal, such as copper, cobalt, aluminum, gold, combinations thereof, or the like. The interconnect structure 74 may be formed by a damascene process, such as a single damascene process, a dual damascene process, or the like.

The die connectors 76 are at a front side 70F of the wafer 70. The die connectors 76 may be conductive pillars, pads, or the like, to which external connections are made. The die connectors 76 are in and/or on the interconnect structure 74. For example, the die connectors 76 may be part of an upper metallization pattern of the interconnect structure 74. The die connectors 76 can be formed of a metal, such as copper, aluminum, or the like, and can be formed by, for example, plating, or the like.

The dielectric layer 78 is at the front side 70F the wafer 70. The dielectric layer 78 is in and/or on the interconnect structure 74. For example, the dielectric layer 78 may be an upper dielectric layer of the interconnect structure 74. The dielectric layer 78 laterally encapsulates the die connectors 76. The dielectric layer 78 may be an oxide, a nitride, a carbide, a polymer, the like, or a combination thereof. The dielectric layer 78 may be formed, for example, by spin coating, lamination, chemical vapor deposition (CVD), or the like. Initially, the dielectric layer 78 may bury the die connectors 76, such that the top surface of the dielectric layer 78 is above the top surfaces of the die connectors 76. The die connectors 76 are exposed through the dielectric layer 78 during formation of the wafer. A removal process can be applied to the various layers to remove excess materials over the die connectors 76. The removal process may be a planarization process such as a chemical mechanical polish (CMP), an etch-back, combinations thereof, or the like. After planarization, the top surfaces of the die connectors 76 and the dielectric layer 78 are coplanar (within process variations) and are exposed at the front side 70F of the wafer 70. As will be described in greater detail below, the planarized front side 70F of the wafer 70 will be bonded to other devices, such as integrated circuit devices.

The conductive vias 80 extend into the interconnect structure 74 and/or the substrate 72. The conductive vias 80 are electrically coupled to metallization patterns of the interconnect structure 74. The conductive vias 80 are also sometimes referred to as TSVs. As an example to form the conductive vias 80, recesses can be formed in the interconnect structure 74 and/or the substrate 72 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 74 or the substrate 72 by, for example, a CMP. Remaining portions of the barrier layer and conductive material form the conductive vias 80.

Integrated circuit devices 50 are bonded to the wafer 70. In this embodiment, the integrated circuit devices 50 include multiple integrated circuit devices 50A, 50B that are placed in each of the package regions 100A, 100B. The integrated circuit devices 50A, 50B may each have a single function (e.g., a logic device, memory device, etc.), or may have multiple functions (e.g., a SoC). In an embodiment, the integrated circuit devices 50A are logic devices and the integrated circuit devices 50B are memory devices. In this embodiment, an integrated circuit device 50A (e.g., a logic device) and an integrated circuit device 50B (e.g., a memory device) are bonded in each of the package regions 100A, 100B. In another embodiment, a single integrated circuit device 50 is bonded in each of the package regions 100A, 100B.

The integrated circuit devices 50 and the wafer 70 are directly bonded in a face-to-face manner by hybrid bonding, such that the front sides 50F of the integrated circuit devices 50 are bonded to the front side 70F of the wafer 70. Specifically, the dielectric layers 58 of the integrated circuit devices 50 are bonded to the dielectric layer 78 of the wafer 70 through dielectric-to-dielectric bonding, without using any adhesive material (e.g., die attach film), and the die connectors 56 of the integrated circuit devices 50 are bonded to the die connectors 76 of the wafer 70 through metal-to-metal bonding, without using any eutectic material (e.g., solder). The bonding may include a pre-bonding and an annealing. During the pre-bonding, a small pressing force is applied to press the integrated circuit devices 50 against the wafer 70. The pre-bonding is performed at a low temperature, such as room temperature, such as a temperature in the range of about 15° C. to about 30° C., and after the pre-bonding, the dielectric layers 58, 78 are bonded to each other. The bonding strength is then improved in a subsequent annealing step, in which the dielectric layers 58, 78 are annealed at a high temperature, such as a temperature in the range of about 100° C. to about 450° C. After the annealing, bonds, such as fusions bonds, are formed bonding the dielectric layers 58, 78. For example, the bonds can be covalent bonds between the material of the dielectric layers 58 and the material of the dielectric layer 78. The die connectors 56, 76 are connected to each other with a one-to-one correspondence. The die connectors 56, 76 may be in physical contact after the pre-bonding, or may expand to be brought into physical contact during the annealing. Further, during the annealing, the material of the die connectors 56, 76 (e.g., copper) intermingles, so that metal-to-metal bonds are also formed. Hence, the resulting bonds between the integrated circuit devices 50 and wafer 70 are hybrid bonds that include both dielectric-to-dielectric bonds and metal-to-metal bonds.

The width of each integrated circuit device 50 is less than the width of the wafer 70, so that multiple integrated circuit devices 50 can be bonded to the wafer 70. As will be described in greater detail below, the integrated circuit devices 50A can also have different widths from the integrated circuit devices 50B. When the integrated circuit devices 50 and the wafer 70 are bonded by hybrid bonding, outer edges 50E and inner edges 50N of the integrated circuit devices 50 interface with the planarized surface of the dielectric layer 78. The outer edges 50E of the integrated circuit devices 50 are those edges of the integrated circuit devices 50 in each respective package region 100A, 100B that face away from others of the integrated circuit devices 50 in the respective package region 100A, 100B. The inner edges 50N of the integrated circuit devices 50 are those edges of the integrated circuit devices 50 in each respective package region 100A, 100B that face towards others of the integrated circuit devices 50 in the respective package region 100A, 100B. The outer edges 50E undergo a large amount of stress, such as more stress than the inner edges 50N, which can be exacerbated when the integrated circuit devices 50 are encapsulated in subsequent processing with a material that has a large Young's modulus and/or a large coefficient of thermal expansion (CTE). Excessive stress at the outer edges 50E can damage the integrated circuit devices 50 (e.g., the interconnect structures 54 and/or the dielectric layers 58), the wafer 70 (e.g., the interconnect structure 74 and/or the dielectric layer 78), or both. For example, delamination of the dielectric layers 58, 78 may occur. As will be described in greater detail below, layers will be formed around the outer edges 50E to buffer the stress at the outer edges 50E. The yield and reliability of the integrated circuit packages 100 may thus be improved, particularly when the integrated circuit devices 50 are subsequently encapsulated.

Figure 3:
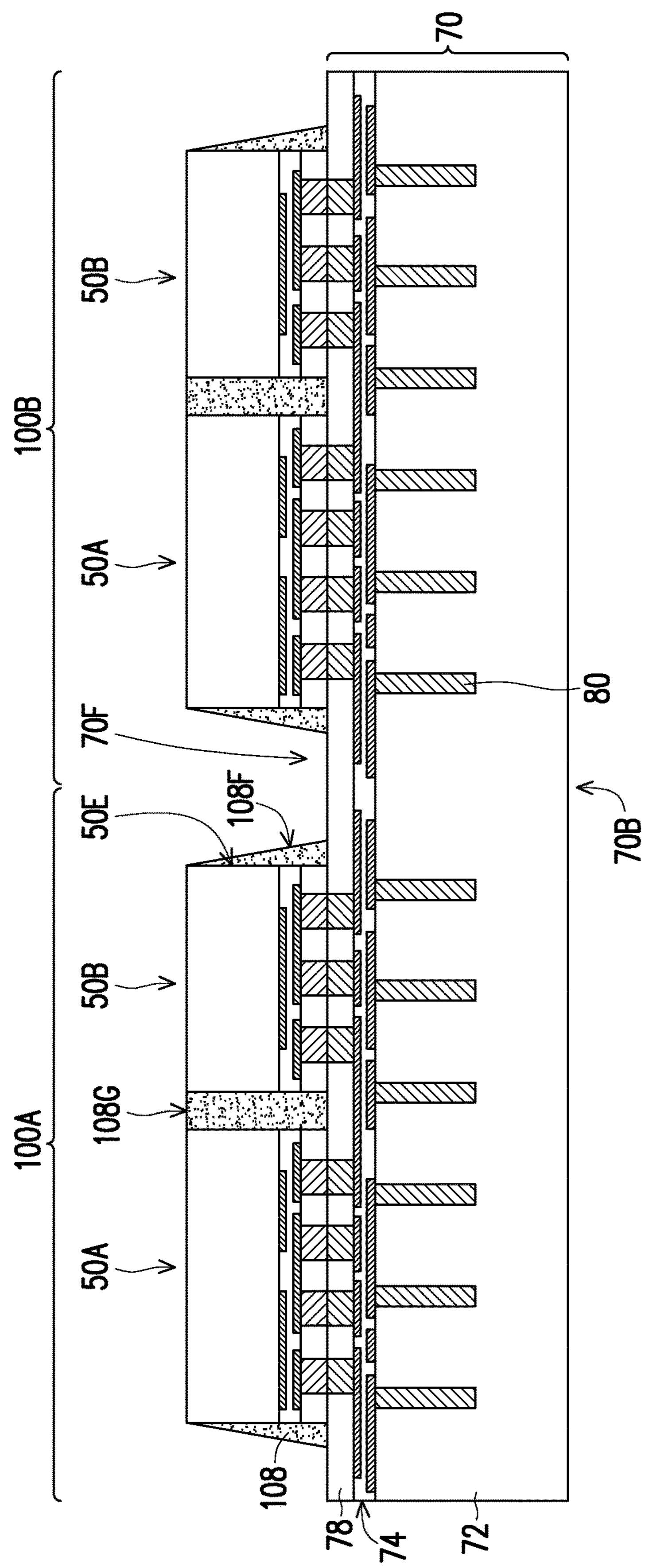

In FIG. 3, buffer layers 108 are dispensed on the front side 70F of the wafer 70 and around the integrated circuit devices 50. Specifically, a buffer layer 108 is dispensed around the integrated circuit devices 50 in each of the package regions 100A, 100B. The buffer layers 108 are formed in location that experience high stress (e.g., the outer edges 50E of the integrated circuit devices 50). The buffer layers 108 are formed of a stress reduction material that helps buffer stress at the outer edges 50E (see FIG. 2). The stress reduction material includes a polymer material and optionally includes fillers and/or a surfactant. The polymer material may be an epoxy, a polyimide-based material, a BCB-based material, a silicone material, an acrylic material, or the like. The fillers are formed of a material that provides mechanical strength and thermal dispersion for the buffer layers 108, such as particles of silica ($SiO_2$). The surfactant may be polyvinyl alcohol or the like. The stress reduction material (including the polymer material, the fillers, and/or the surfactant) may be formed by printing (e.g., inkjet printing), dispensing (e.g., standard dispensing, tilt dispensing, etc.), spin coating, lamination, deposition, or the like.

In this embodiment, the buffer layers 108 have fillet portions 108F and gap portions 108G. The gap portions 108G are disposed in the gaps between the integrated circuit devices 50. The fillet portions 108F are disposed and extend along the outer edges 50E of the integrated circuit devices 50. In other embodiments, the gap portions 108G are omitted and buffer layers 108 only have the fillet portions 108F.

In this embodiment, the fillet portions 108F and the gap portions 108G have straight top surfaces. In other embodiments, the fillet portions 108F and/or the gap portions 108G have concave top surfaces. The types of top surfaces can be determined by the amount (e.g., volume) of stress reduction material that is dispensed, and whether a surfactant is included in the stress reduction material. As will be described in greater detail below, dispensing less stress reduction material and/or including a surfactant can form concave top surfaces.

In this embodiment, the buffer layers 108 extend completely up the sidewalls of the integrated circuit devices 50, such that no portions of the sidewalls of the integrated circuit devices 50 are exposed to (e.g., contacted by) a subsequently formed encapsulant. In other embodiments, the buffer layers 108 can extend partially up the sidewalls of the integrated circuit devices 50, such that portions of the sidewalls of the integrated circuit devices 50 are exposed to the subsequently formed encapsulant. As will be described in greater detail below, dispensing less stress reduction material can form the buffer layers 108 to extend up less of the sidewalls of the integrated circuit devices 50.

Figure 4:
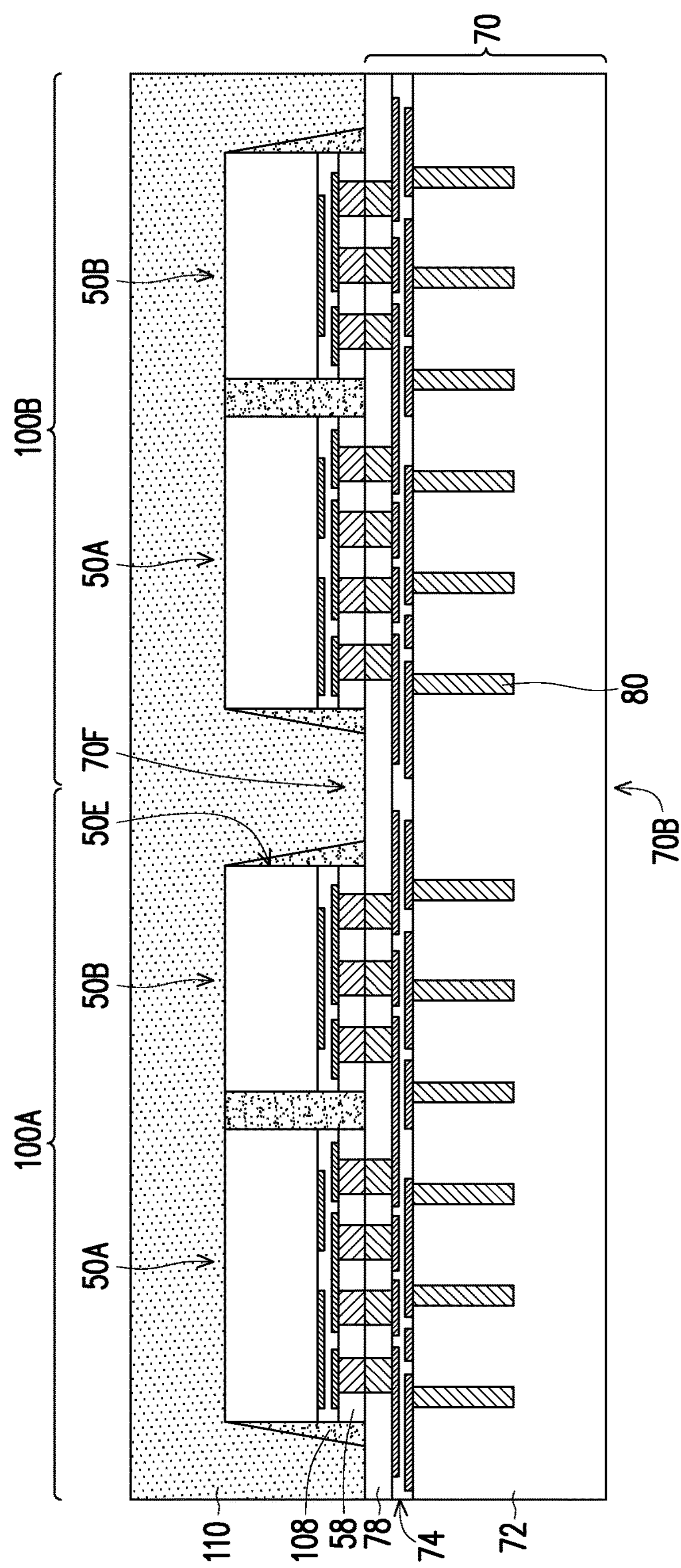

In FIG. 4, an encapsulant 110 is formed on the various components. The encapsulant 110 is formed of a molding material or compound. The molding material includes a polymer material and optionally includes fillers. The polymer material may be an epoxy or the like. The fillers are formed of a material that provides mechanical strength and thermal dispersion for the encapsulant 110, such as particles of silica ($SiO_2$). The molding material (including the polymer material and/or the fillers) may be formed by compression molding, transfer molding, or the like. The polymer material of the encapsulant 110 is different from the polymer material of the buffer layers 108, and is formed by a different method than the stress reduction material of the buffer layers 108. The encapsulant 110 may be formed over the front side 70F of the wafer 70 such that the integrated circuit devices 50 and the buffer layers 108 are buried or covered. The encapsulant 110 is then cured. A planarization process may be performed to planarize the top surface of the encapsulant 110. The planarization process may be a chemical mechanical polish (CMP), an etch-back, combinations thereof, or the like. In the illustrated embodiment, the integrated circuit devices 50 remain covered after the encapsulant 110 is planarized. In another embodiment, the integrated circuit devices 50 are exposed by the planarization of the encapsulant 110.

The encapsulant 110 surrounds and protects the integrated circuit devices 50. However, the molding material of the encapsulant 110 has a larger Young's modulus and a larger CTE than the dielectric material of the dielectric layers 58, 78. Expansion of the encapsulant 110 at high temperatures can impart stress on the integrated circuit devices 50, particularly at the outer edges 50E, which can damage the integrated circuit devices 50 and/or the wafer 70. The buffer layers 108 are formed of a stress reduction material that is softer than the encapsulant 110 at high temperatures, and thus helps buffer stress imparted by the encapsulant 110 at the outer edges 50E (see FIG. 2) during expansion. The stress reduction material of the buffer layers 108 has several properties that allow it to effectively buffer stress from the molding material of the encapsulant 110 at high temperatures. Specifically, the stress reduction material of the buffer layers 108 has a different Young's modulus, a different CTE, a different filler load (e.g., quantity of fillers), a different average filler particle size, and a different elongation than the molding material of the encapsulant 110.

The stress reduction material of the buffer layers 108 has a lower Young's modulus than the molding material of the encapsulant 110. In some embodiments, the Young's modulus of the stress reduction material is from about 5% to about 90% of the Young's modulus of the molding material. For example, the stress reduction material can have a Young's modulus in the range of about 0.001 GPa to about 0.9 GPa, and the molding material can have a Young's modulus in the range of about 1 GPa to about 2.5 GPa.

The stress reduction material of the buffer layers 108 has a similar or greater CTE than the molding material of the encapsulant 110. In some embodiments, the CTE of the stress reduction material is from about 150% to about 500% of the CTE of the molding material. For example, the stress reduction material can have a CTE in the range of about 15 ppm/° C. to about 70 ppm/° C. below its Glass Transition Temperature ($T_g$) and a CTE in the range of about 50 ppm/° C. to about 300 ppm/° C. above its $T_g$, and the modling material can have a CTE in the range of about 5 ppm/° C. to about 22 ppm/° C. below its $T_g$ and a CTE in the range of about 22 ppm/° C. to about 60 ppm/° C. above its $T_g$.

The stress reduction material of the buffer layers 108 has a smaller filler load than the molding material of the encapsulant 110 (when the stress reduction material and the molding material both include fillers). In some embodiments, the filler load of the stress reduction material is from about 0% to about 90% of the filler load of the molding material. For example, the stress reduction material can have a filler load in the range of about 0% to about 78%, and the molding material can have a filler load in the range of about 75% to about 92%.

The stress reduction material of the buffer layers 108 has a smaller average filler particle size than the molding material of the encapsulant 110 (when the stress reduction material and the molding material both include fillers). In some embodiments, the average filler particle size of the stress reduction material is from about 0.2% to about 60% of the average filler particle size of the molding material. For example, the stress reduction material can have an average filler particle size in the range of about 0.01 μm to about 10 μm, and the molding material can have an average filler particle size in the range of about 5 μm to about 50 μm.

The stress reduction material of the buffer layers 108 has a greater elongation than the molding material of the encapsulant 110. In some embodiments, the elongation of the stress reduction material is from about 120% to about 5000% of the elongation of the molding material. For example, the stress reduction material can have an elongation in the range of about 2% δ to about 100% δ, and the molding material can have an elongation in the range of about 1.2% δ to about 5% δ.

Forming the stress reduction material of the buffer layers 108 and the molding material of the encapsulant 110 with a Young's modulus, CTE, filler load, average filler particle size, and elongation in the ranges discussed above allows the buffer layers 108 to buffer enough stress from the encapsulant 110 to avoid damage to the integrated circuit devices 50 and/or the wafer 70 at the outer edges 50E. Forming the stress reduction material of the buffer layers 108 and the molding material of the encapsulant 110 with a Young's modulus, CTE, filler load, average filler particle size, or elongation outside the ranges discussed above may not allow the buffer layers 108 to buffer enough stress from the encapsulant 110 to avoid damage to the integrated circuit devices 50 and/or the wafer 70 at the outer edges 50E.

In addition to the differing properties discussed above, the buffer layers 108 and the encapsulant 110 both have different properties from the dielectric layers 58, 78. Specifically, the dielectric material of the dielectric layers 58, 78 has a greater Young's modulus and a lesser CTE than both the stress reduction material of the buffer layers 108 and the molding material of the encapsulant 110. In some embodiments, the Young's modulus of the molding material is from about 3% to about 50% the Young's modulus of the dielectric material, and the Young's modulus of the stress reduction material is from about 6% to about 30% the Young's modulus of the dielectric material. In some embodiments, the CTE of the molding material is from about 500% to about 2500% the CTE of the dielectric material, and the CTE of the stress reduction material is from about 3000% to about 30000% the CTE of the dielectric material. Continuing the above example, the dielectric material can have a Young's modulus in the range of about 30 GPa to about 300 GPa, and can have a CTE in the range of about 0.3 ppm/° C. to about 5 ppm/° C.

Figure 5:
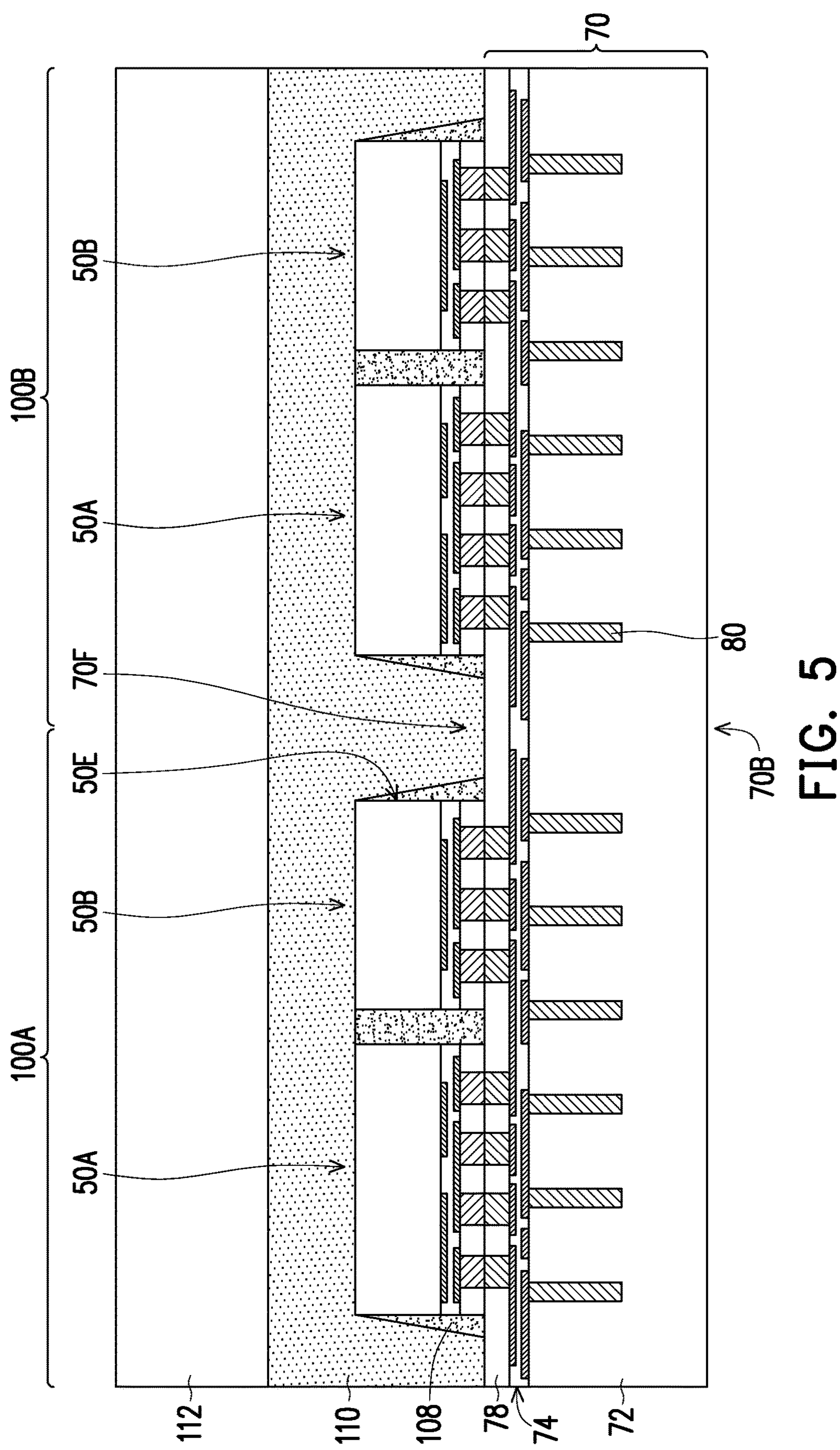

In FIG. 5, the intermediate structure is flipped over (not illustrated) to prepare for processing of the back side 70B of the substrate 72. The intermediate structure may be placed on a carrier substrate 112 or other suitable support structure for subsequent processing. For example, the carrier substrate 112 may be attached to the encapsulant 110. The carrier substrate 112 may be attached to the encapsulant 110 by a release layer. The release layer may be formed of a polymer-based material, which may be removed along with the carrier substrate 112 from the structure after processing. In some embodiments, the carrier substrate 112 is a substrate such as a bulk semiconductor or a glass substrate. In some embodiments, the release layer is an epoxy-based thermal-release material, which loses its adhesive property when heated, such as a light-to-heat-conversion (LTHC) release coating.

Figure 6:
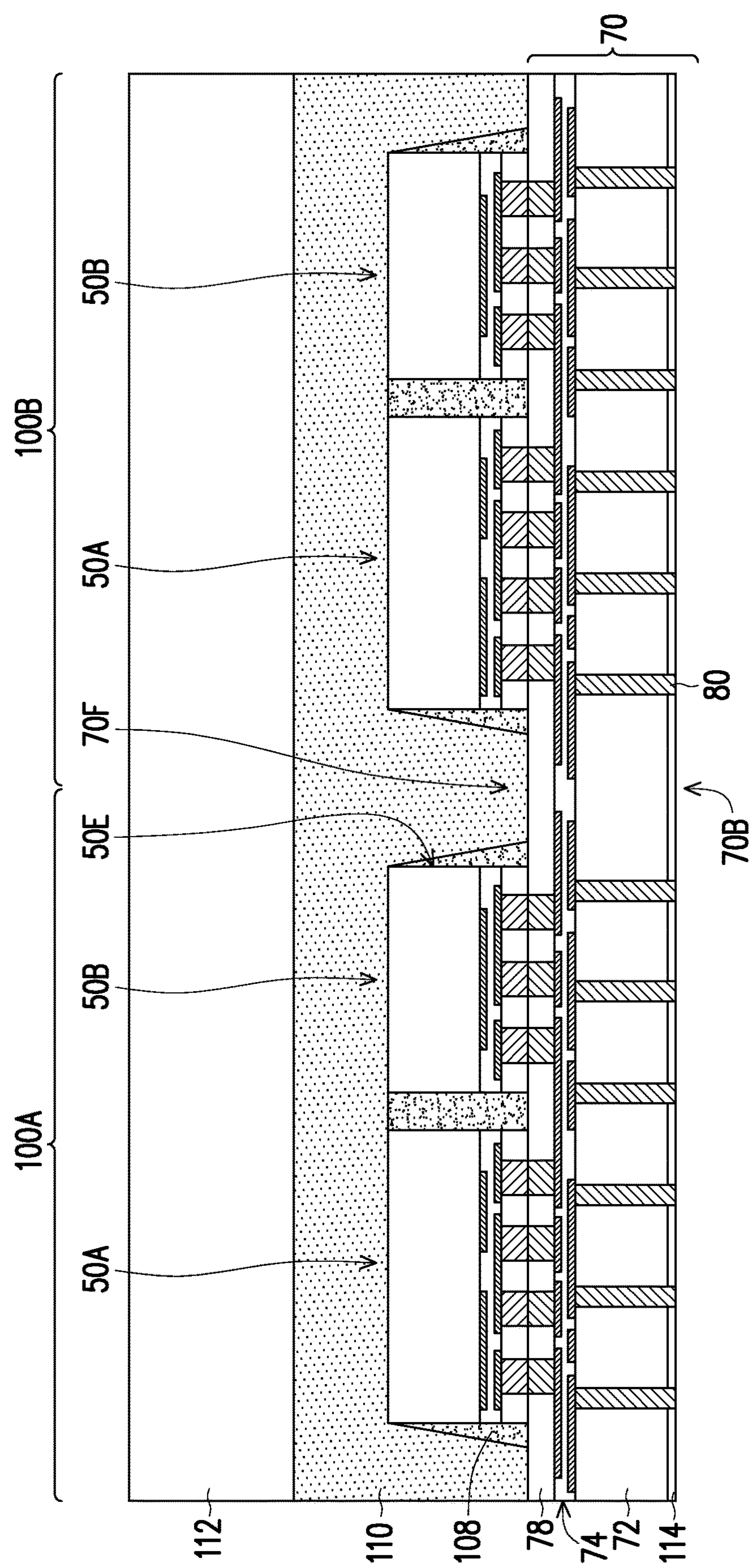

In FIG. 6, the substrate 72 is thinned to expose the conductive vias 80. Exposure of the conductive vias 80 may be accomplished by a thinning process, such as a grinding process, a chemical-mechanical polish (CMP), an etch-back, combinations thereof, or the like. In the illustrated embodiment, a recessing process is performed to recess the back surface of the substrate 72 such that the conductive vias 80 protrude at the back side 70B of the wafer 70. The recessing process may be, e.g., a suitable etch-back process, chemical-mechanical polish (CMP), or the like. In some embodiments, the thinning process for exposing the conductive vias 80 includes a CMP, and the conductive vias 80 protrude at the back side 70B of the wafer 70 as a result of dishing that occurs during the CMP. An insulating layer 114 is then formed on the back surface of the substrate 72, surrounding the protruding portions of the conductive vias 80. In some embodiments, the insulating layer 114 is formed from a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. Initially, the insulating layer 114 may bury the conductive vias 80. A removal process can be applied to the various layers to remove excess materials over the conductive vias 80. The removal process may be a planarization process such as a chemical mechanical polish (CMP), an etch-back, combinations thereof, or the like. After planarization, the exposed surfaces of the conductive vias 80 and the insulating layer 114 are coplanar (within process variations) and are exposed at the back side 70B of the wafer 70. In another embodiment, the insulating layer 114 is omitted, and the exposed surfaces of the substrate 72 and the conductive vias 80 are coplanar (within process variations).

In FIG. 7, under bump metallurgies (UBMs) 132 are formed on the exposed surfaces of the conductive vias 80 and the insulating layer 114 (or the substrate 72, when the insulating layer 114 is omitted). As an example to form the UBMs 132, a seed layer (not illustrated) is formed over the exposed surfaces of the conductive vias 80 and the insulating layer 114/substrate 72. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 132. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 132.

Further, conductive connectors 136 are formed on the UBMs 132. The conductive connectors 136 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 136 may include a conductive material such as solder, copper, aluminum, gold, nickel, silver, palladium, tin, the like, or a combination thereof. In some embodiments, the conductive connectors 136 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 136 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In FIG. 8, a carrier debonding is performed to detach (debond) the carrier substrate 112 from the encapsulant 110. In embodiments where the carrier substrate 112 is attached to the encapsulant 110 by a release layer, the debonding includes projecting a light such as a laser light or an ultraviolet (UV) light on the release layer so that the release layer decomposes under the heat of the light and the carrier substrate 112 can be removed. The structure is then flipped over and placed on a tape (not illustrated).

The encapsulant 110 is then thinned to expose the integrated circuit devices 50. Exposure of the integrated circuit devices 50 may be accomplished by a thinning process, such as a grinding process, a chemical-mechanical polish (CMP), an etch-back, combinations thereof, or the like. After the thinning process, the top surfaces of the encapsulant 110 and the integrated circuit devices 50 are coplanar (within process variations). The thinning is performed until a desired amount of the encapsulant 110 has been removed. Although the buffer layers 108 protect the outer edges 50E from stress, the encapsulant 110 provides more overall protection for the resulting integrated circuit packages 100 than the buffer layers 108. Thus, enough of the encapsulant 110 remains after thinning so that the integrated circuit packages 100 contain more of the encapsulant 110 (by volume) than the buffer layers 108. In some embodiments, the volume of the buffer layers 108 is from about 2% to about 10% of the volume of the encapsulant 110. For example, in each integrated circuit package 100, the buffer layers 108 can have a volume in the range of about 0.26 $mm^3$ to about 1.3 $mm^3$ when the encapsulant 110 has a volume of about 13 $mm^3$. In this embodiment, the top surfaces of the fillet portions 108F and the gap portions 108G (see FIG. 3) and the encapsulant 110 are also coplanar (within process variations). In other embodiments, some or all of the top surfaces of the buffer layers 108 are disposed below the top surface of the encapsulant 110.

In FIG. 9, a singulation process is performed by cutting along scribe line regions, e.g., between the package regions 100A, 100B. The singulation process may include sawing, dicing, or the like. For example, the singulation process can include sawing the insulating layer 114, the encapsulant 110, the dielectric layer 78, the interconnect structure 74, and the substrate 72. The singulation process singulates the package regions 100A, 100B from one another. The resulting, singulated integrated circuit package 100 is from one of the package regions 100A, 100B. The singulation process forms interposers 140 from the singulated portions of the wafer 70 and the insulating layer 114 (if present). Each of the integrated circuit packages 100 includes an interposer 140. As a result of the singulation process, the outer sidewalls of the interposer 140 and the encapsulant 110 are laterally coterminous (within process variations).

The integrated circuit package 100 is then flipped and attached to a package substrate 200 using the conductive connectors 136. The package substrate 200 includes a substrate core 202, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate core 202.

The substrate core 202 may include active and passive devices (not illustrated). Devices such as transistors, capacitors, resistors, combinations of these, and the like may be used to generate the structural and functional requirements of the design for the system. The devices may be formed using any suitable methods.

The substrate core 202 may also include metallization layers and vias (not illustrated) and bond pads 204 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like). In some embodiments, the substrate core 202 is substantially free of active and passive devices.

The conductive connectors 136 are reflowed to attach the UBMs 132 to the bond pads 204. The conductive connectors 136 connect the integrated circuit package 100, including metallization patterns of the interconnect structure 74, to the package substrate 200, including metallization layers in the substrate core 202. Thus, the package substrate 200 is electrically connected to the integrated circuit devices 50. In some embodiments, passive devices (e.g., surface mount devices (SMDs), not illustrated) may be attached to the integrated circuit package 100 (e.g., bonded to the UBMs 132) prior to mounting on the package substrate 200. In such embodiments, the passive devices may be bonded to a same surface of the integrated circuit package 100 as the conductive connectors 136. In some embodiments, passive devices (e.g., SMDs, not illustrated) may be attached to the package substrate 200, e.g., to the bond pads 204.

In some embodiments, an underfill 206 is formed between the integrated circuit package 100 and the package substrate 200, surrounding the conductive connectors 136 and the UBMs 132. The underfill 206 may be formed by a capillary flow process after the integrated circuit package 100 is attached or may be formed by a suitable deposition method before the integrated circuit package 100 is attached. The underfill 206 may be a continuous material extending from the package substrate 200 to the interposer 140 (e.g., the insulating layer 114). The material of the underfill 206 is different from the stress reduction material of the buffer layers 108, and is formed by a different method than the stress reduction material of the buffer layers 108.

Optionally, a heat spreader 208 is attached to the integrated circuit package 100. The heat spreader 208 may be formed from a material with high thermal conductivity, such as steel, stainless steel, copper, the like, or combinations thereof. The heat spreader 208 protects the integrated circuit package 100 and forms a thermal pathway to conduct heat from the various components of the integrated circuit package 100 (e.g., the integrated circuit devices 50). The heat spreader 208 is in contact with the integrated circuit devices 50, the encapsulant 110, and optionally the buffer layers 108.

Figure 10:
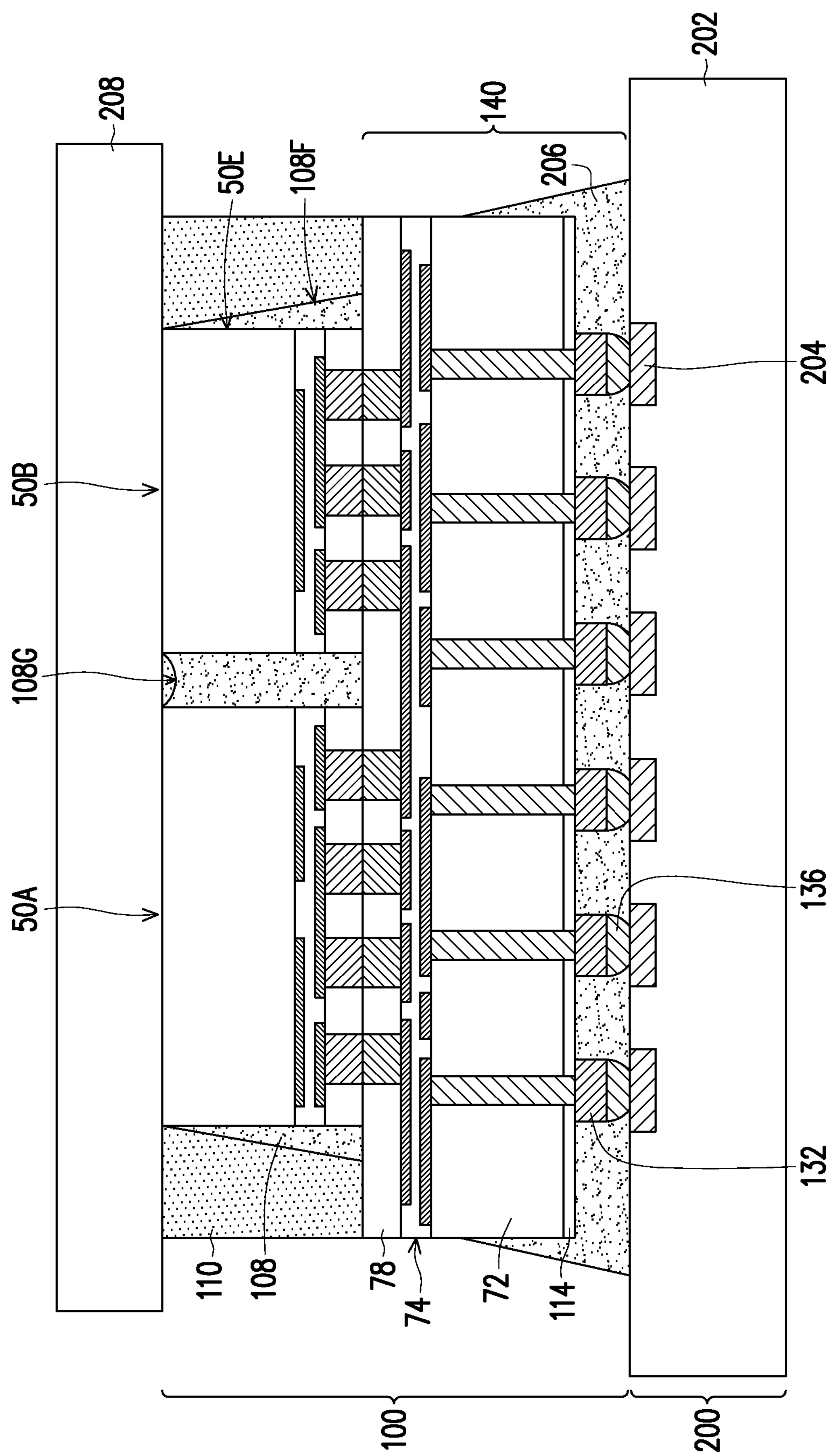
FIG. 10 is a cross-sectional view of an integrated circuit package, in accordance with some embodiments.

FIG. 10 is a cross-sectional view of an integrated circuit package, in accordance with some embodiments. This embodiment is similar to the embodiment described with respect to FIG. 9, except the gap portion 108G has a concave top surface while the fillet portions 108F have straight top surfaces. At least a portion of the top surface of the gap portion 108G is thus disposed below and buried beneath the top surface of the encapsulant 110. The gap portion 108G can be formed with a concave top surface by dispensing less stress reduction material of the buffer layer 108 than the embodiment of FIG. 9. For example, the volume of the buffer layer 108 in this embodiment can be from about 70% to about 95% of the volume of the buffer layer 108 in the embodiment of FIG. 9.

Figure 11:
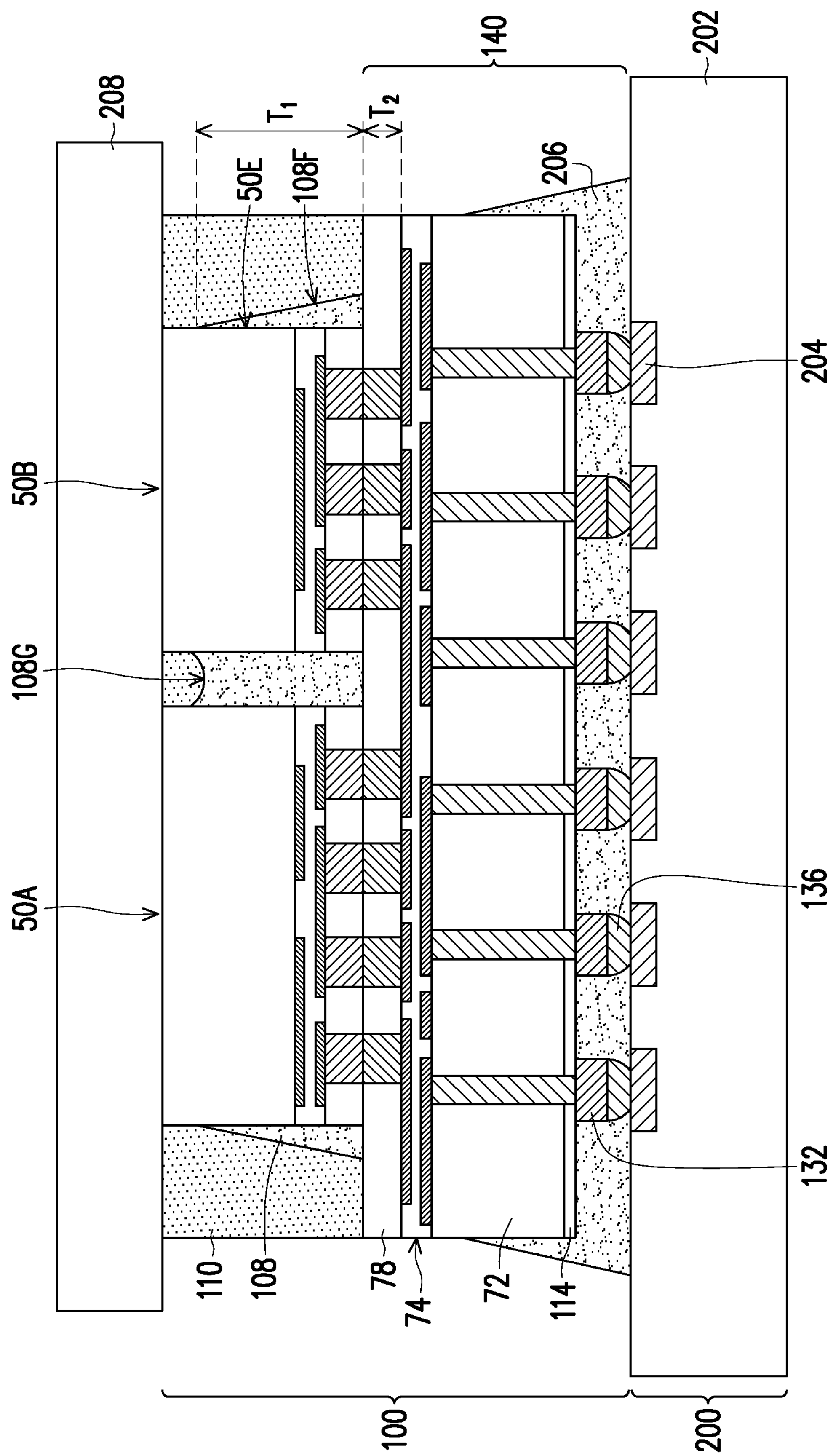
FIG. 11 is a cross-sectional view of an integrated circuit package, in accordance with some embodiments.

FIG. 11 is a cross-sectional view of an integrated circuit package, in accordance with some embodiments. This embodiment is similar to the embodiment described with respect to FIG. 10, except the buffer layer 108 extends only partially up the sidewalls of the integrated circuit devices 50, such that portions of the sidewalls of the integrated circuit devices 50 are exposed to the encapsulant 110. Specifically, the buffer layer 108 covers the sidewalls of the interconnect structure 54 and a portion of the sidewalls of the semiconductor substrate 52 (see FIG. 1). The top surfaces of the fillet portions 108F and the gap portion 108G are thus disposed below and buried beneath the top surface of the encapsulant 110. The buffer layer 108 can be formed to extend only partially up the sidewalls of the integrated circuit devices 50 by dispensing less stress reduction material of the buffer layer 108 than the embodiment of FIG. 10. For example, the volume of the buffer layer 108 in this embodiment can be from about 50% to about 80% of the volume of the buffer layer 108 in the embodiment of FIG. 10. Further, the thickness $T_1$ of the buffer layer 108 is larger than the thickness $T_2$ of the dielectric layer 78, which can help further reduce the stress at the outer edges 50E.

Figure 12:
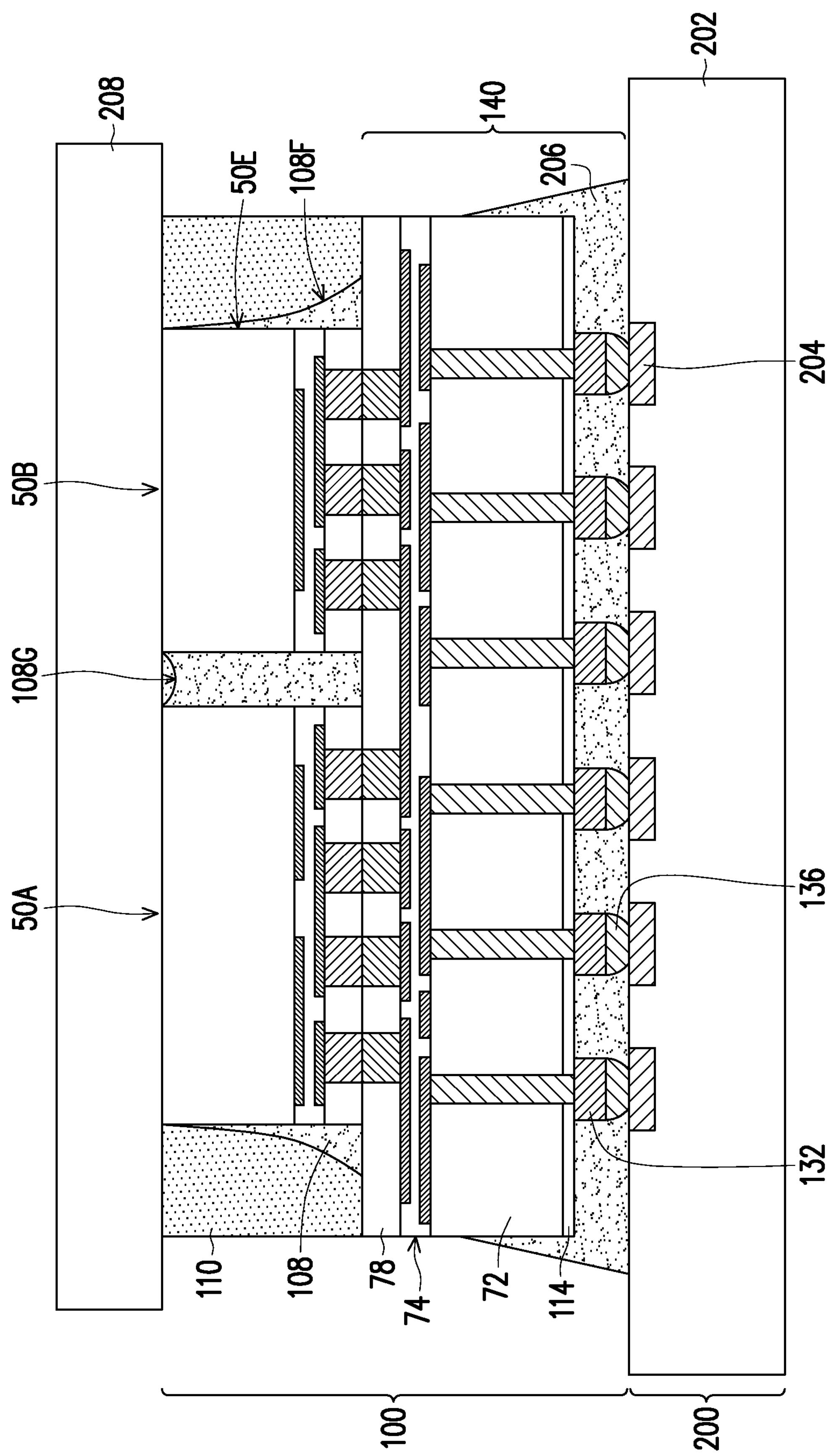
FIG. 12 is a cross-sectional view of an integrated circuit package, in accordance with some embodiments.

FIG. 12 is a cross-sectional view of an integrated circuit package, in accordance with some embodiments. This embodiment is similar to the embodiment described with respect to FIG. 10, except the fillet portions 108F and the gap portion 108G each have concave top surfaces. At least a portion of the top surface of the gap portion 108G is thus disposed below and buried beneath the top surface of the encapsulant 110. The fillet portions 108F and the gap portion 108G can be formed with concave top surfaces by dispensing less stress reduction material of the buffer layer 108 than the embodiment of FIG. 10 and/or by including a surfactant in the stress reduction material. For example, the volume of the buffer layer 108 in this embodiment can be from about 50% to about 70% of the volume of the buffer layer 108 in the embodiment of FIG. 10. Also in this embodiment, the buffer layer 108 extends completely up the sidewalls of the integrated circuit devices 50, such that no portions of the sidewalls of the integrated circuit devices 50 are exposed to the encapsulant 110. Specifically, the buffer layer 108 covers the sidewalls of the interconnect structure 54 and the sidewalls of the semiconductor substrate 52 (see FIG. 1).

Figure 13:
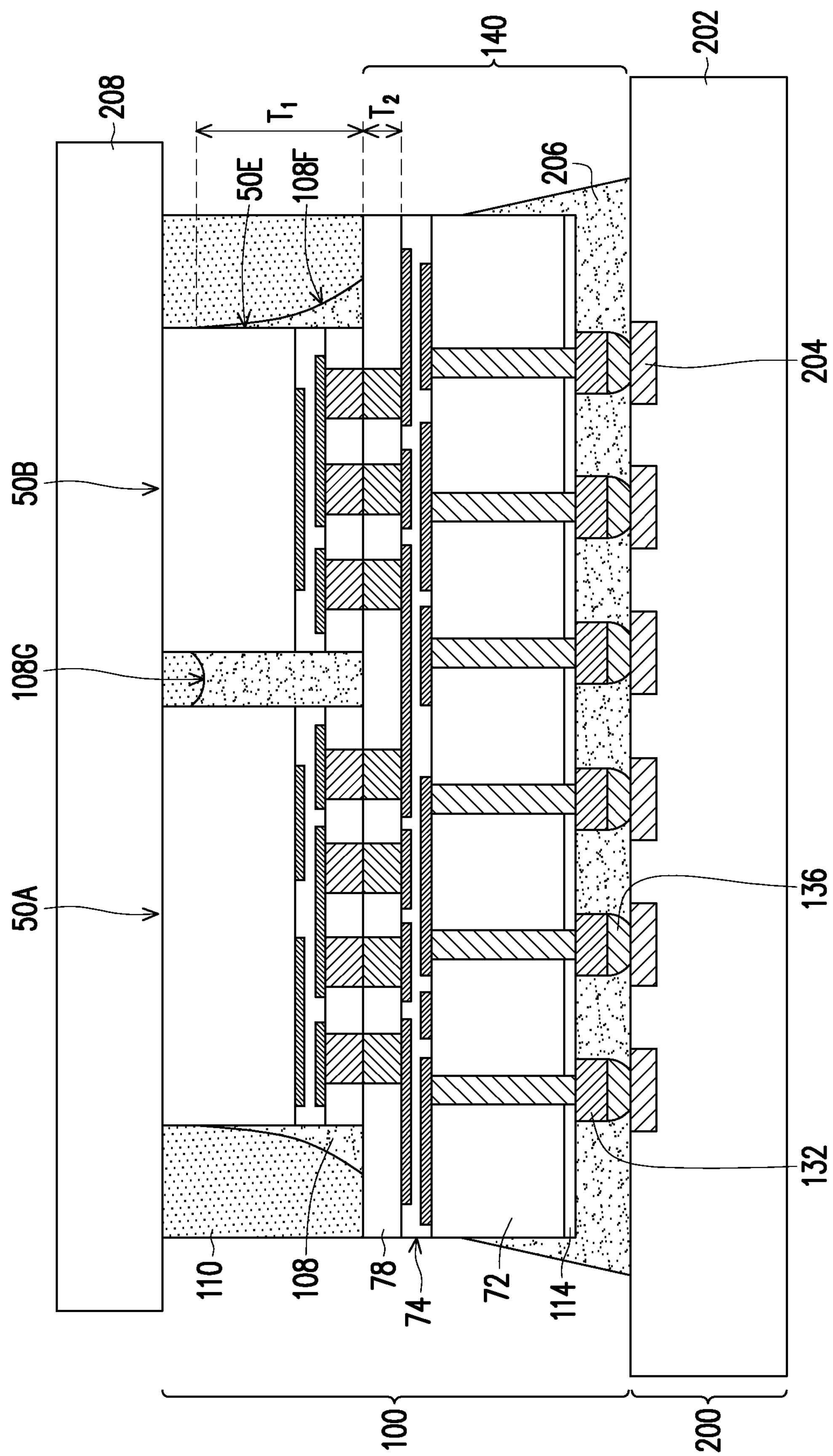
FIG. 13 is a cross-sectional view of an integrated circuit package, in accordance with some embodiments.

FIG. 13 is a cross-sectional view of an integrated circuit package, in accordance with some embodiments. This embodiment is similar to the embodiment described with respect to FIG. 12, except the buffer layer 108 extends only partially up the sidewalls of the integrated circuit devices 50, such that portions of the sidewalls of the integrated circuit devices 50 are exposed to the encapsulant 110. Specifically, the buffer layer 108 covers the sidewalls of the interconnect structure 54 and a portion of the sidewalls of the semiconductor substrate 52 (see FIG. 1). The top surfaces of the fillet portions 108F and the gap portion 108G are thus disposed below and buried beneath the top surface of the encapsulant 110. The buffer layer 108 can be formed to extend only partially up the sidewalls of the integrated circuit devices 50 by dispensing less stress reduction material of the buffer layer 108 than the embodiment of FIG. 12. For example, the volume of the buffer layer 108 in this embodiment can be from about 50% to about 80% of the volume of the buffer layer 108 in the embodiment of FIG. 12. The thickness $T_1$ of the buffer layer 108 is larger than the thickness $T_2$ of the dielectric layer 78, which can help further reduce the stress at the outer edges 50E.

Figure 14:
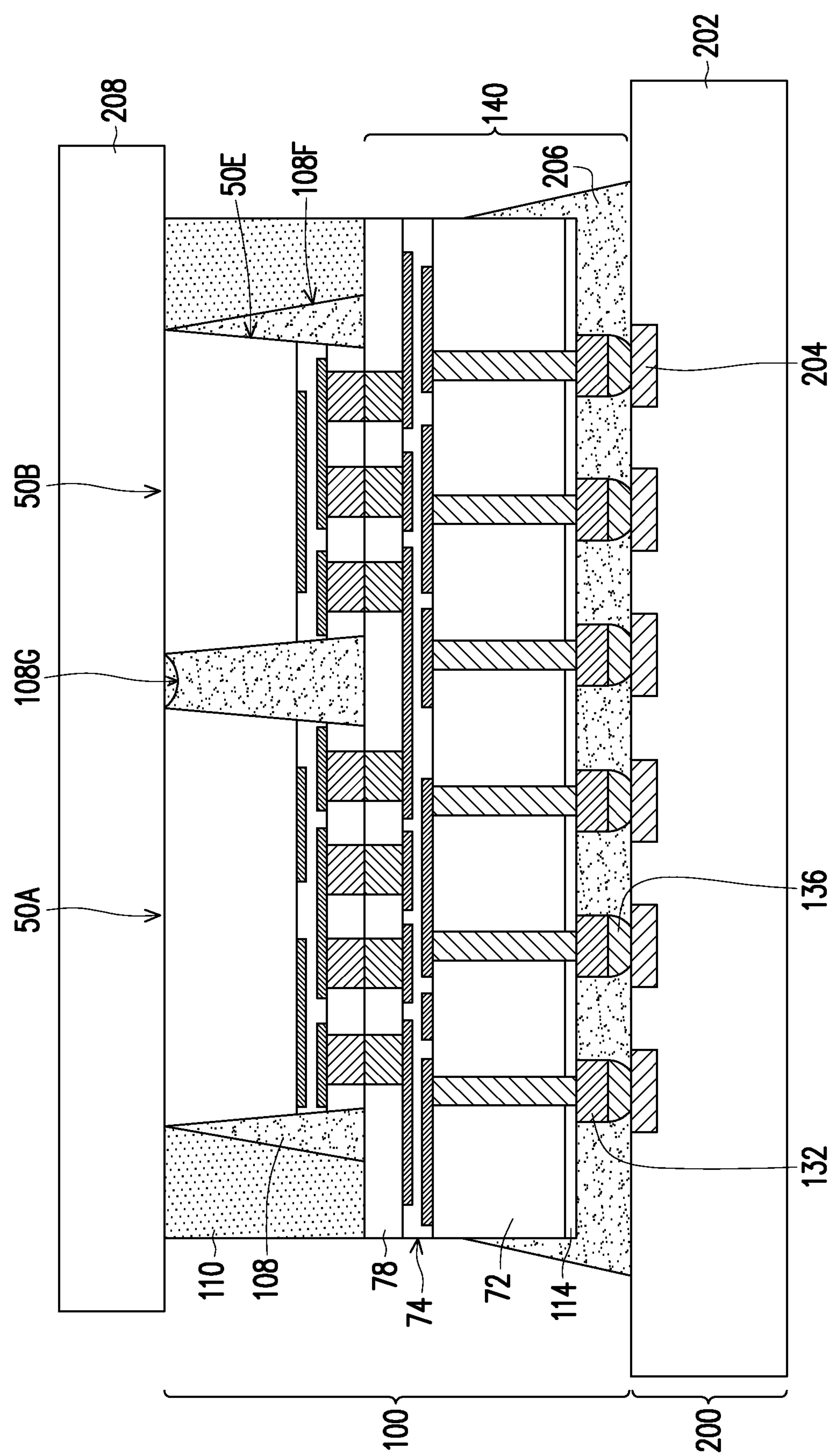
FIG. 14 is a cross-sectional view of an integrated circuit package, in accordance with some embodiments.

FIG. 14 is a cross-sectional view of an integrated circuit package, in accordance with some embodiments. This embodiment is similar to the embodiment described with respect to FIG. 9, except the buffer layer 108 is at least partially disposed between the interposer 140 and each of the integrated circuit devices 50. The integrated circuit devices 50 have tapered sidewalls, with widths that increase in a direction extending from the back sides of the integrated circuit devices 50 to the front sides of the integrated circuit devices 50. The integrated circuit devices 50 can be formed with tapered sidewalls by performing a trimming process at edges of the semiconductor substrate 52 and/or the interconnect structure 54 (see FIG. 1) before bonding the integrated circuit devices 50 to the interposer 140. The trimming process can include a mecahnical, laser, or plasma sawing process. Forming the integrated circuit devices 50 with tapered sidewalls can help further reduce the stress at the outer edges 50E.

Figure 15:
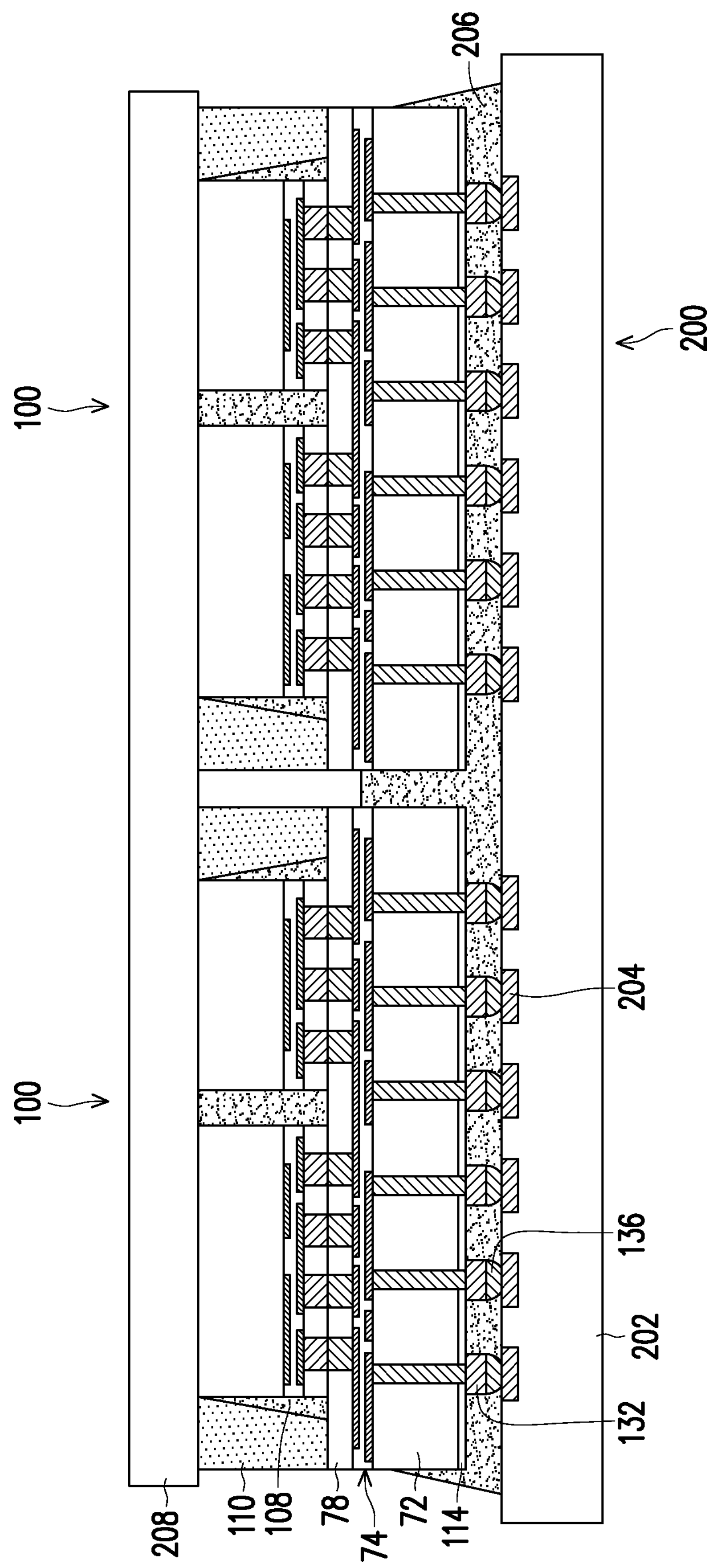
FIG. 15 is a cross-sectional view of an integrated circuit package, in accordance with some embodiments.

FIG. 15 is a cross-sectional view of an integrated circuit package, in accordance with some embodiments. This embodiment is similar to the embodiment described with respect to FIG. 9, except multiple integrated circuit packages 100 are attached to a same package substrate 200, and a same heat spreader 208 is attached to each of the integrated circuit packages 100. In an embodiment, the resulting device is a multi-chip module (MCM) package, although it should be appreciated that embodiments may be applied to other 3DIC packages. A same underfill 206 can be formed between the package substrate 200 and each of the integrated circuit packages 100.

FIGS. 16A through 16E are top-down views of integrated circuit packages, in accordance with various embodiments. Several layouts for the buffer layer 108 are illustrated. As shown in the top-down views, the integrated circuit devices 50 have four corners 50C and four sidewalls 505, with each sidewall 505 extending between two corners 50C. As is also more clearly shown, the integrated circuit devices 50A can have greater widths than the integrated circuit devices 50B in multiple directions.

Figure 16A:
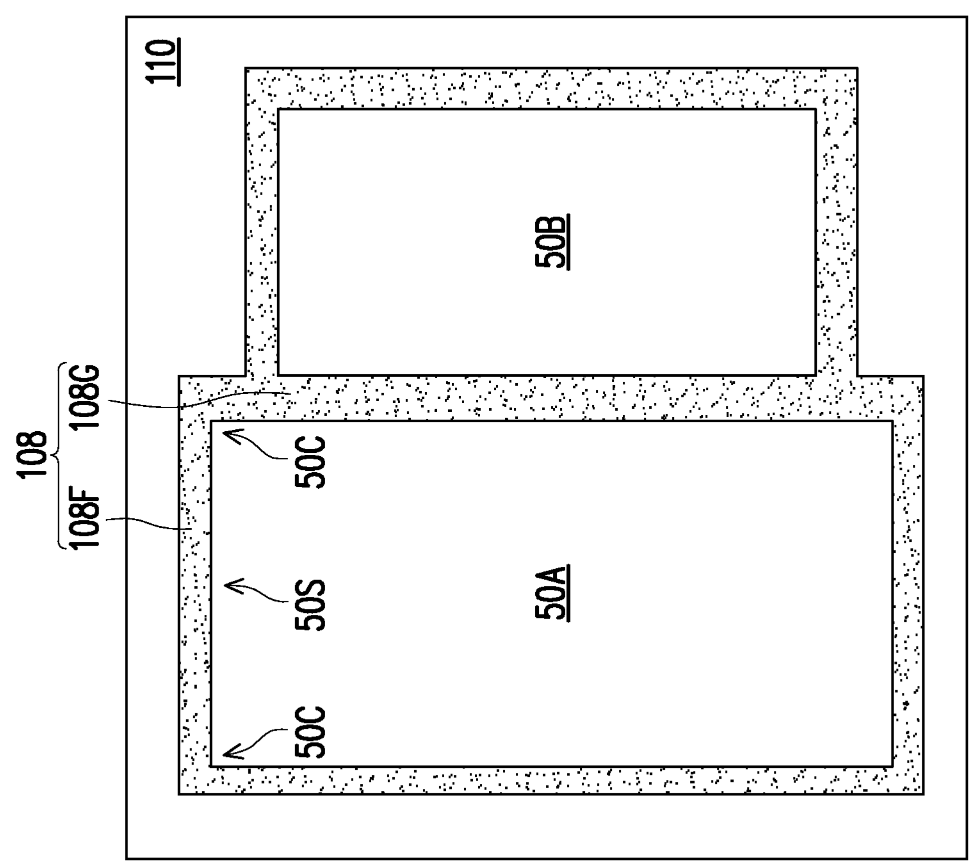
FIGS. 16A through 16E are top-down views of integrated circuit packages, in accordance with various embodiments.

In FIG. 16A, both the fillet portions 108F and the gap portion 108G are exposed through the encapsulant 110 after thinning of the encapsulant 110. FIG. 16A may be a top-down view of the embodiment of FIG. 9. In this embodiment, the exposed fillet portions 108F extend around the corners 50C of the integrated circuit devices 50 and extend continuously along the sidewalls 50S of the integrated circuit devices 50.

Figure 16B:
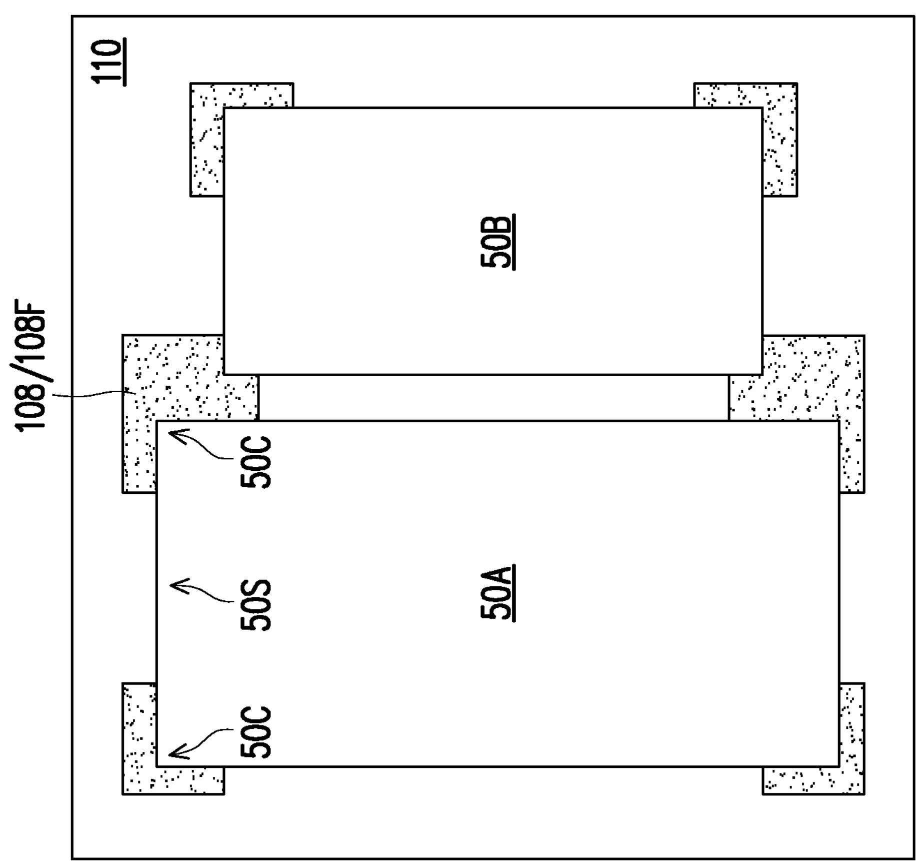

In FIG. 16B, some of the fillet portions 108F are exposed through the encapsulant 110 after thinning of the encapsulant 110, but the gap portion 108G remains covered after thinning of the encapsulant 110. FIG. 16B may be a top-down view of the embodiment of FIG. 10. In this embodiment, the exposed fillet portions 108F extend around the corners 50C of the integrated circuit devices 50 and extend discontinuously along the sidewalls 50S of the integrated circuit devices 50.

Figure 16C:
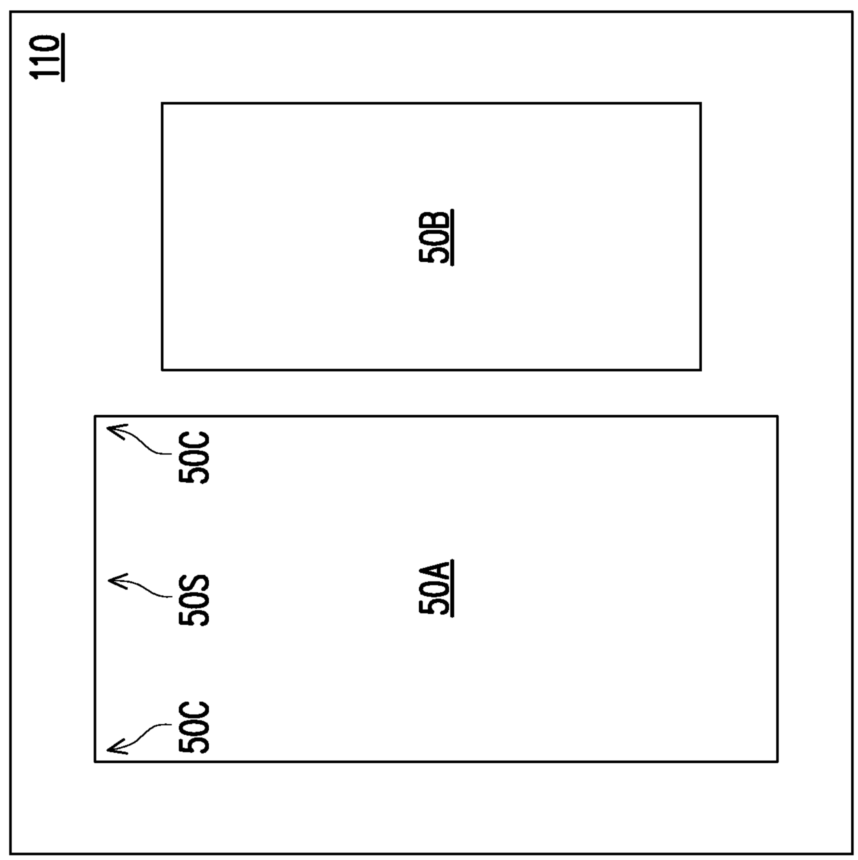

In FIG. 16C, neither the fillet portions 108F nor the gap portion 108G are exposed through the encapsulant 110, but rather remain covered after thinning of the encapsulant 110. FIG. 16C may be a top-down view of the embodiments of FIGS. 11 and 13.

Figure 16D:
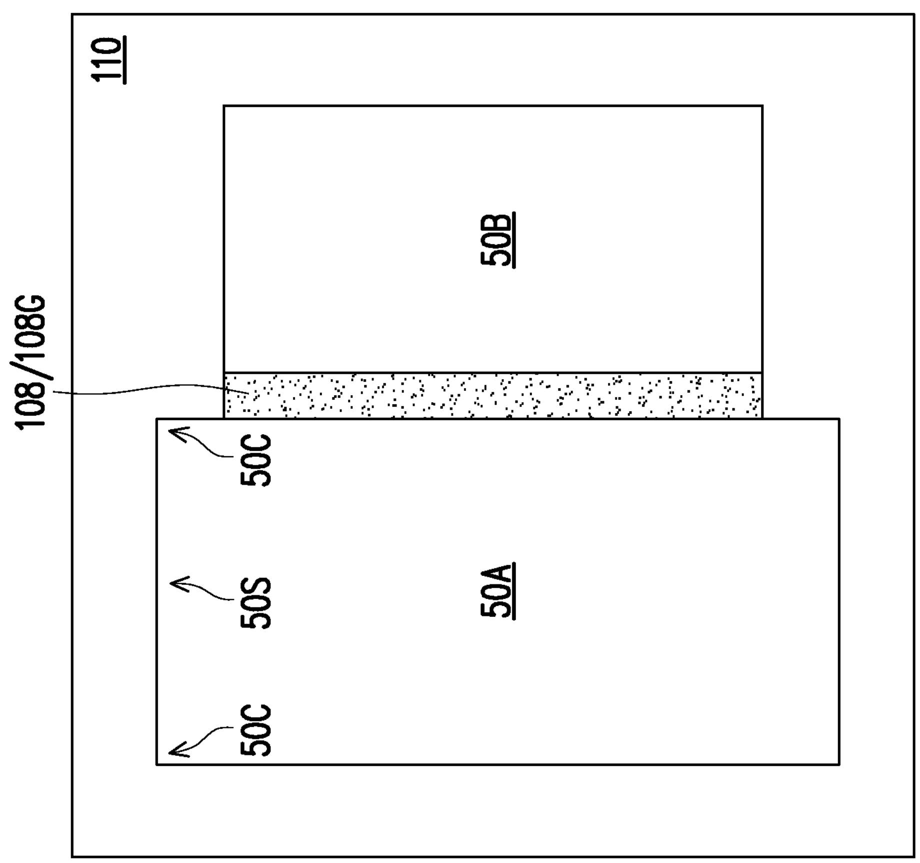

In FIG. 16D, the gap portion 108G is exposed through the encapsulant 110 after thinning of the encapsulant 110, but the fillet portions 108F remain covered after thinning of the encapsulant 110. FIG. 16D may be a top-down view of the embodiment of FIG. 9.

Figure 16E:
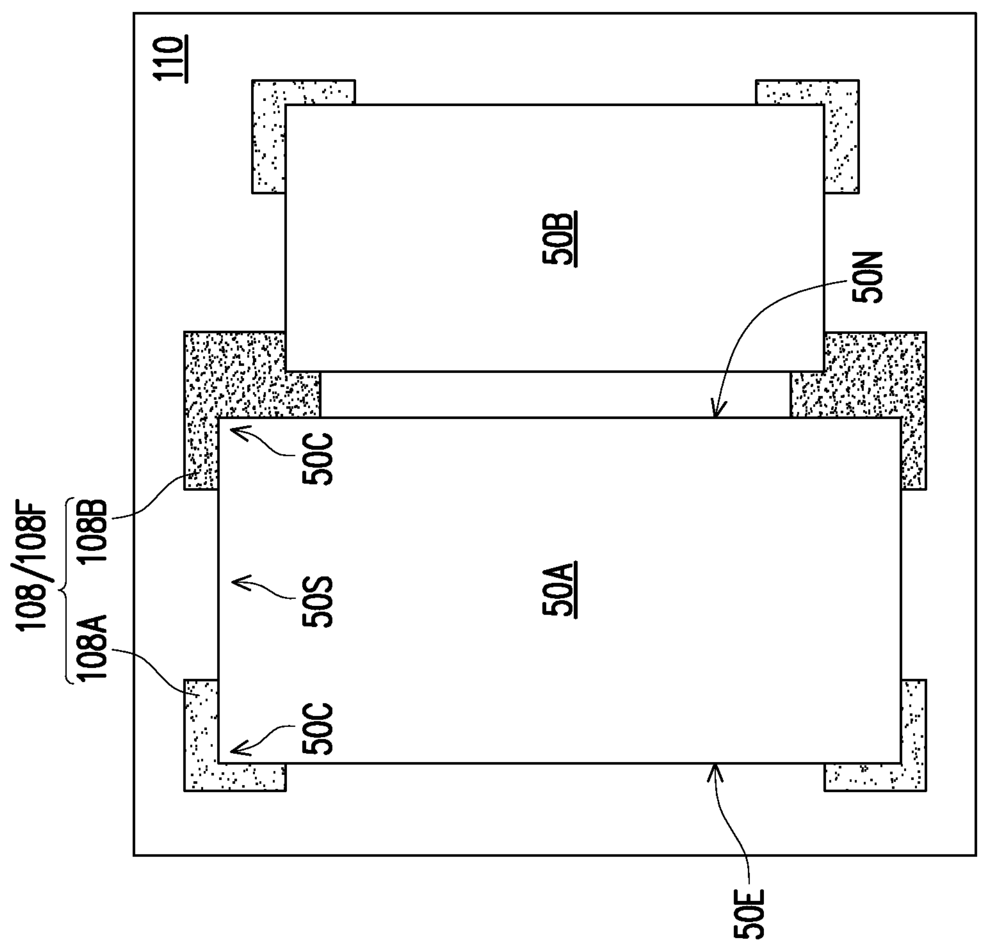

In FIG. 16E, some of the fillet portions 108F are exposed through the encapsulant 110 after thinning of the encapsulant 110, but the gap portion 108G remains covered after thinning of the encapsulant 110. FIG. 16E may be a top-down view of the embodiment of FIG. 10. In this embodiment, the buffer layer 108 includes first portions 108A formed of a first polymer material and second portions 108B formed of a second polymer material. The first portions 108A can be those portions around the outer edges 50E of the integrated circuit devices 50. The second portions 108B can be those portions around the inner edges 50N of the integrated circuit devices 50. The first polymer material and the second polymer material are each similar to the stress reduction material discussed above for FIG. 3, and are different stress reduction materials from one another. For example, the first portions 108A can have a lesser Young's modulus/CTE than the second portions 108B. In other words, in the embodiments of FIGS. 16A through 16D, the buffer layer 108 includes a single stress reduction material, but in the embodiment of FIG. 16E, the buffer layer 108 includes a plurality of stress reduction materials. The stress reduction materials can be selected based on the amount of stress buffering desired in the various regions of the integrated circuit packages 100.

Embodiments may achieve advantages. When the integrated circuit devices 50 are directly bonded to the wafer 70 by hybrid bonding, expansion of the encapsulant 110 at high temperatures can impart stress on the integrated circuit devices 50, particularly at the outer edges 50E, which can damage the integrated circuit devices 50 and/or the wafer 70. For example, delamination of the dielectric layers 58, 78 may occur. The buffer layers 108 help buffer stress in regions of the integrated circuit packages 100 that experience high stress, such as the outer edges 50E of the integrated circuit devices 50. Specifically, the buffer layers 108 are formed of a stress reduction material that expands less than the encapsulant 110 at high temperatures, and thus helps buffer stress imparted by the encapsulant 110 during expansion. The integrated circuit packages 100 may be repeatedly subjected to high temperatures during manufacturing, such as during testing. Forming the buffer layers 108 helps protect the integrated circuit packages 100 during high temperature processing, improving the yield and reliability of the integrated circuit packages 100.

In an embodiment, a method includes: bonding a first integrated circuit device and a second integrated circuit device to an interposer with dielectric-to-dielectric bonds and with metal-to-metal bonds; forming a stress reduction material around the first integrated circuit device and the second integrated circuit device, the stress reduction material having a first Young's modulus; encapsulating the stress reduction material, the first integrated circuit device, and the second integrated circuit device with a molding material, the molding material having a second Young's modulus, the first Young's modulus less than the second Young's modulus; and thinning the molding material to expose the first integrated circuit device and the second integrated circuit device.

In some embodiments of the method, the stress reduction material includes a first polymer material and the molding material includes a second polymer material, the first polymer material being different from the second polymer material. In some embodiments of the method, the stress reduction material further includes first fillers and the molding material further includes second fillers. In some embodiments of the method, the stress reduction material further includes a surfactant. In some embodiments of the method, the first polymer material is a first epoxy, a polyimide-based material, a benzocyclobuten (BCB) based material, a silicone material, or an acrylic material, and the second polymer material is a second epoxy. In some embodiments of the method, the stress reduction material has a gap portion and fillet portions, the gap portion disposed between the first integrated circuit device and the second integrated circuit device, the fillet portions disposed along outer edges of the first integrated circuit device and the second integrated circuit device, where the gap portion is exposed after thinning the molding material, and where the fillet portions are exposed after thinning the molding material. In some embodiments of the method, the stress reduction material has a gap portion and fillet portions, the gap portion disposed between the first integrated circuit device and the second integrated circuit device, the fillet portions disposed along outer edges of the first integrated circuit device and the second integrated circuit device, where the gap portion remains covered after thinning the molding material, and where the fillet portions remain covered after thinning the molding material. In some embodiments of the method, the stress reduction material has a gap portion and fillet portions, the gap portion disposed between the first integrated circuit device and the second integrated circuit device, the fillet portions disposed along outer edges of the first integrated circuit device and the second integrated circuit device, where the gap portion is exposed after thinning the molding material, and where the fillet portions remain covered after thinning the molding material. In some embodiments of the method, the stress reduction material has a gap portion and fillet portions, the gap portion disposed between the first integrated circuit device and the second integrated circuit device, the fillet portions disposed along outer edges of the first integrated circuit device and the second integrated circuit device, where the gap portion remains covered after thinning the molding material, and where the fillet portions are exposed after thinning the molding material.

In an embodiment, a device includes: an interposer; a first integrated circuit device bonded to the interposer with dielectric-to-dielectric bonds and with metal-to-metal bonds; a second integrated circuit device bonded to the interposer with dielectric-to-dielectric bonds and with metal-to-metal bonds; a buffer layer around the first integrated circuit device and the second integrated circuit device, the buffer layer including a stress reduction material having a first Young's modulus; and an encapsulant around the buffer layer, the first integrated circuit device, and the second integrated circuit device, the encapsulant including a molding material having a second Young's modulus, the first Young's modulus less than the second Young's modulus.

In some embodiments of the device, the stress reduction material has a first coefficient of thermal expansion and the molding material has a second coefficient of thermal expansion, the first coefficient of thermal expansion greater than the second coefficient of thermal expansion. In some embodiments of the device, the stress reduction material includes first fillers with a first filler load and the molding material includes second fillers with a second filler load, the first filler load less than the second filler load. In some embodiments of the device, the stress reduction material includes first fillers with a first average filler particle size and the molding material includes second fillers with a second average filler particle size, the first average filler particle size less than the second average filler particle size. In some embodiments of the device, the stress reduction material has a first elongation and the molding material has a second elongation, the first elongation less than the second elongation.

In an embodiment, a device includes: an interposer; a first integrated circuit device bonded to the interposer with dielectric-to-dielectric bonds and with metal-to-metal bonds; a second integrated circuit device bonded to the interposer with dielectric-to-dielectric bonds and with metal-to-metal bonds; a buffer layer having a gap portion and fillet portions, the gap portion disposed between the first integrated circuit device and the second integrated circuit device, the fillet portions disposed along outer edges of the first integrated circuit device and the second integrated circuit device; and an encapsulant around the buffer layer, the first integrated circuit device, and the second integrated circuit device, the encapsulant having a different Young's modulus, a different coefficient of thermal expansion, a different filler load, and a different average filler particle size, and a different elongation than the buffer layer.

In some embodiments of the device, the gap portion has a concave top surface and the fillet portions have concave top surfaces. In some embodiments of the device, the gap portion has a straight top surface and the fillet portions have straight top surfaces. In some embodiments of the device, the gap portion has a concave top surface and the fillet portions have straight top surfaces. In some embodiments of the device, the buffer layer includes a single stress reduction material. In some embodiments of the device, the buffer layer includes a plurality of stress reduction materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

connecting a first integrated circuit device and a second integrated circuit device to a first side of an interposer, the first integrated circuit device connected to the interposer with dielectric-to-dielectric bonds and with metal-to-metal bonds;

forming a stress reduction material around the first integrated circuit device and on the interposer, the stress reduction material having a first Young's modulus;

encapsulating the stress reduction material, the first integrated circuit device, and the second integrated circuit device with a molding material, the molding material having a second Young's modulus, the first Young's modulus less than the second Young's modulus;

attaching a package substrate to a second side of the interposer; and forming an underfill material between the package substrate and the interposer, the underfill material different from the stress reduction material.

2. The method of claim 1, wherein the stress reduction material comprises a first polymer material and the molding material comprises a second polymer material, the first polymer material being different from the second polymer material.

3. The method of claim 2, wherein the stress reduction material further comprises first fillers and the molding material further comprises second fillers.

4. The method of claim 2, wherein the stress reduction material further comprises a surfactant.

5. The method of claim 2, wherein the first polymer material is a first epoxy, a polyimide-based material, a benzocyclobuten based material, a silicone material, or an acrylic material, and the second polymer material is a second epoxy.

6. The method of claim 1, wherein the stress reduction material has a gap portion and fillet portions, the gap portion disposed between the first integrated circuit device and the second integrated circuit device, the fillet portions disposed along outer edges of the first integrated circuit device, the method further comprising:

thinning the molding material to expose the first integrated circuit device, the second integrated circuit device, the gap portion, and the fillet portions.

7. The method of claim 1, wherein the stress reduction material has a gap portion and fillet portions, the gap portion disposed between the first integrated circuit device and the second integrated circuit device, the fillet portions disposed along outer edges of the first integrated circuit device, the method further comprising:

thinning the molding material to expose the first integrated circuit device and the second integrated circuit device, wherein the gap portion remains covered after thinning the molding material, and wherein the fillet portions remain covered after thinning the molding material.

8. The method of claim 1, wherein the stress reduction material has a gap portion and fillet portions, the gap portion disposed between the first integrated circuit device and the second integrated circuit device, the fillet portions disposed along outer edges of the first integrated circuit device, the method further comprising:

thinning the molding material to expose the first integrated circuit device, the second integrated circuit device, and the gap portion, wherein the fillet portions remain covered after thinning the molding material.

9. The method of claim 1, wherein the stress reduction material has a gap portion and fillet portions, the gap portion disposed between the first integrated circuit device and the second integrated circuit device, the fillet portions disposed along outer edges of the first integrated circuit device, the method further comprising:

thinning the molding material to expose the first integrated circuit device, the second integrated circuit device, and the fillet portions, wherein the gap portion remains covered after thinning the molding material.

10. A device comprising:

a package substrate;

an interposer attached to the package substrate;

a first integrated circuit device bonded to the interposer with dielectric-to-dielectric bonds and with metal-to-metal bonds;

a buffer layer around the first integrated circuit device, the buffer layer comprising a stress reduction material having a first Young's modulus; and an encapsulant around the buffer layer and the first integrated circuit device, the encapsulant comprising a molding material having a second Young's modulus, the first Young's modulus less than the second Young's modulus.

11. The device of claim 10, wherein the stress reduction material has a first coefficient of thermal expansion and the molding material has a second coefficient of thermal expansion, the first coefficient of thermal expansion greater than the second coefficient of thermal expansion.

12. The device of claim 10, wherein the stress reduction material comprises first fillers with a first filler load and the molding material comprises second fillers with a second filler load, the first filler load less than the second filler load.

13. The device of claim 10, wherein the stress reduction material comprises first fillers with a first average filler particle size and the molding material comprises second fillers with a second average filler particle size, the first average filler particle size less than the second average filler particle size.

14. The device of claim 10, wherein the stress reduction material has a first elongation and the molding material has a second elongation, the first elongation greater than the second elongation.

15. The device of claim 10 further comprising:

an underfill between the package substrate and the interposer, the underfill comprising an underfill material, the underfill material being different from the stress reduction material.

16. A device comprising:

a package substrate;

an interposer attached to the package substrate;

a first integrated circuit device bonded to the interposer with dielectric-to-dielectric bonds and with metal-to-metal bonds;

a buffer layer having fillet portions disposed along outer edges of the first integrated circuit device; and an encapsulant around the buffer layer and the first integrated circuit device, the encapsulant having a different Young's modulus, a different coefficient of thermal expansion, a different filler load, and a different average filler particle size, and a different elongation than the buffer layer.

17. The device of claim 16, wherein the fillet portions have concave top surfaces.

18. The device of claim 16, wherein the fillet portions have straight top surfaces.

19. The device of claim 16, wherein the buffer layer comprises a single stress reduction material.

20. The device of claim 16, wherein the buffer layer comprises a plurality of stress reduction materials.

* * * * *